US012777958B2

(12) United States Patent
Wang et al.

(10) Patent No.: US 12,777,958 B2
(45) Date of Patent: Oct. 27, 2026

(54) SEMICONDUCTOR STRUCTURES AND METHODS OF FORMING THE SAME

(71) Applicant: Taiwan Semiconductor Manufacturing Company, Ltd., Hsin-Chu (TW)

(72) Inventors: Hsing-Hsiang Wang, Hsinchu (TW); Jiann-Horng Lin, Hsinchu City (TW); Huan-Just Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 372 days.

(21) Appl. No.: 18/403,979

(22) Filed: Jan. 4, 2024

(65) Prior Publication Data

US 2025/0054885 A1 Feb. 13, 2025

Related U.S. Application Data

(60) Provisional application No. 63/519,124, filed on Aug. 11, 2023.

(51) Int. Cl.

*H10W 72/90* (2026.01)
*H10W 70/05* (2026.01)
(Continued)

(52) U.S. Cl.

CPC ......... *H10W 72/90* (2026.01); *H10W 72/019* (2026.01); *H10W 70/05* (2026.01); (Continued)

(58) Field of Classification Search

CPC ............... H10W 72/90; H10W 72/019; H10W 70/05; H10W 70/60; H10W 70/66; (Continued)

(56) References Cited

U.S. PATENT DOCUMENTS 9,711,473 B1 * 7/2017 Kuo .................... H10W 72/012
10,192,755 B2 * 1/2019 Matsumoto ......... H10W 20/039
(Continued)

FOREIGN PATENT DOCUMENTS

TW I778594 B 9/2022

OTHER PUBLICATIONS

Tu et al., "Semiconductor Structures and Methods of Forming the Same" U.S. Appl. No. 18/194,224, filed Mar. 31, 2023, Assignee: Taiwan Semiconductor Manufacturing Company, Ltd. 18 pages of specification, 18 pages of drawings.

(Continued)

*Primary Examiner* — Mark W Tornow
(74) *Attorney, Agent, or Firm* — HAYNES AND BOONE, LLP

(57) ABSTRACT

Semiconductor structures and methods are provided. An exemplary method includes receiving a structure comprising a metal feature, a first passivation structure over the metal feature, and a first opening extending through the first passivation structure and exposing the metal feature. The exemplary method also includes forming a conductive layer in the first opening; forming a second passivation structure over the conductive layer, performing a first etching process to form a second opening extending through the second passivation structure and exposing the conductive layer, performing a second etching process to selectively remove an upper portion of the second passivation structure to enlarge an upper portion of the second opening, and after the performing of the second etching process, forming a conductive feature in the second opening.

20 Claims, 27 Drawing Sheets

(51) Int. Cl.

| | |
|---|---|
| ***H10W 70/60*** | (2026.01) |
| ***H10W 70/66*** | (2026.01) |
| ***H10W 72/00*** | (2026.01) |
| ***H10W 72/20*** | (2026.01) |
| ***H10W 72/29*** | (2026.01) |

(52) U.S. Cl.
CPC ............ *H10W 70/60* (2026.01); *H10W 70/66* (2026.01); *H10W 72/012* (2026.01); *H10W 72/01223* (2026.01); *H10W 72/01235* (2026.01); *H10W 72/01238* (2026.01); *H10W 72/01938* (2026.01); *H10W 72/20* (2026.01); *H10W 72/222* (2026.01); *H10W 72/242* (2026.01); *H10W 72/252* (2026.01); *H10W 72/29* (2026.01); *H10W 72/923* (2026.01); *H10W 72/942* (2026.01); *H10W 72/952* (2026.01); *H10W 72/953* (2026.01)

(58) Field of Classification Search
CPC ......... H10W 72/012; H10W 72/01223; H10W 72/01235; H10W 72/01238; H10W 72/01938; H10W 72/20; H10W 72/222; H10W 72/242; H10W 72/252; H10W 72/29; H10W 72/923; H10W 72/942; H10W 72/952; H10W 72/953; H10W 70/652
See application file for complete search history.

(56) References Cited

U.S. PATENT DOCUMENTS

| | | | | |
|---|---|---|---|---|
| 11,961,762 | B2 * | 4/2024 | Cheng ................. | H10W 20/063 |
| 2019/0139918 | A1 * | 5/2019 | Shindo ................ | H10W 72/019 |

OTHER PUBLICATIONS

Hsueh et al., "Metal Bump Structures and Methods of Forming the Same" U.S. Appl. No. 18/365,667, filed Aug. 4, 2023, 23 pages of Specification, 29 pages of drawings.
Huang et al., "Methods of Forming Bonding Structures" U.S. Appl. No. 18/313,786, 24 pages of specification, 20 pages of drawings.

* cited by examiner

SEMICONDUCTOR STRUCTURES AND METHODS OF FORMING THE SAME

PRIORITY

This application claims the priority of U.S. Provisional Application Ser. No. 63/519,124 filed Aug. 11, 2023, entitled “Conductive pads and passivation structures,” the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, ICs are formed on a semiconductor substrate. Each IC chip is further attached (such as by bonding) to a circuit board, such as a printed circuit board (PCB) in electronic products. A redistribution layer (RDL) of conductive features (e.g., metal lines, vias) may be formed to reroute bond connections from the edge to the center of the chip. A conductive feature in an RDL layer may therefore come between an interconnect structure and a solder bump. A lot of efforts have been devoted to reinforcing and protecting conductive features in the RDL from being damaged by, for example, etching processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
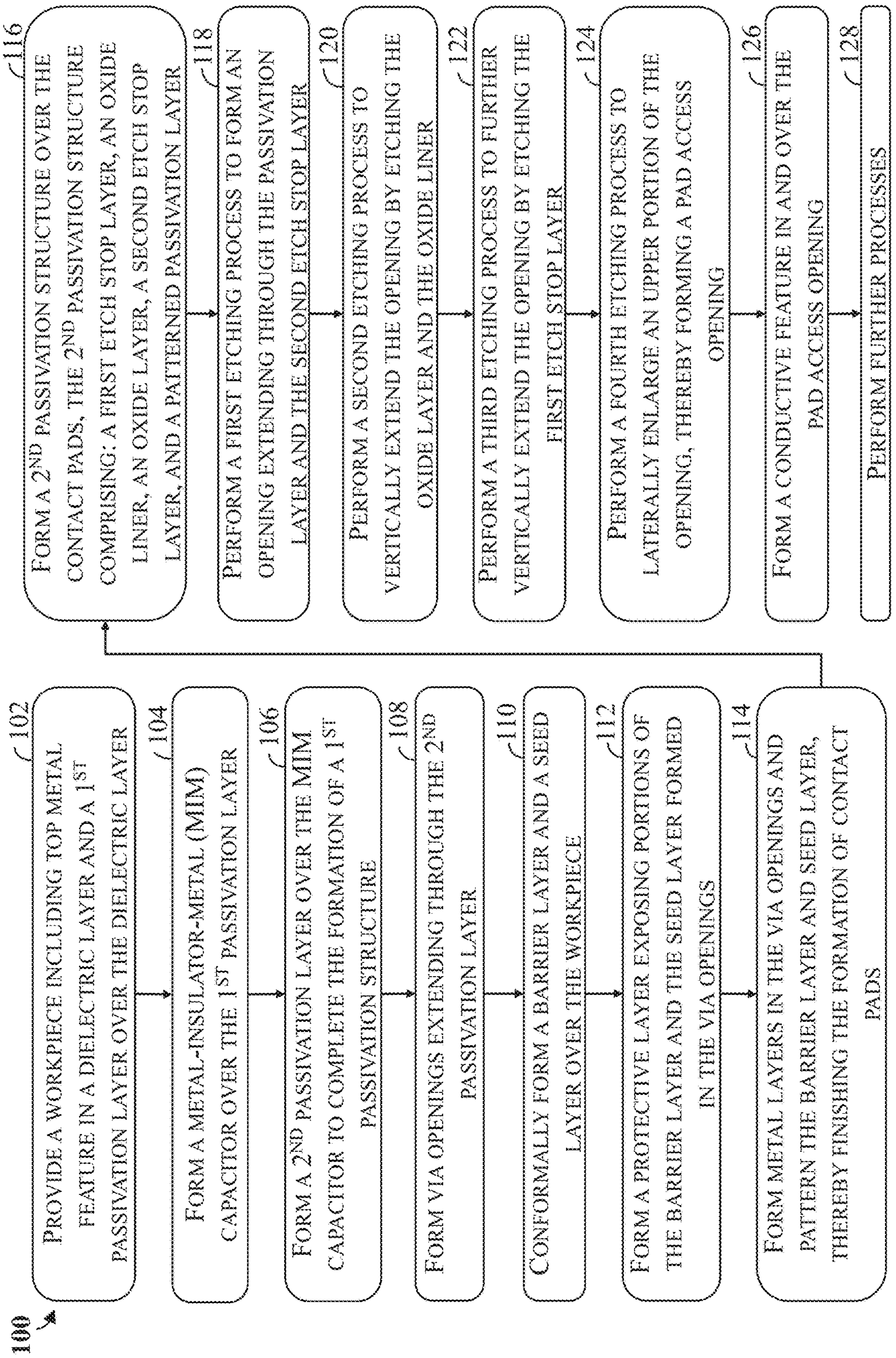
FIG. 1 is a flow chart of a method for fabricating a semiconductor structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with “about,” “approximate,” and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of “about 5 nm” can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In integrated circuit (IC) fabrication, a redistribution layer (RDL) refers to an additional metal layer over a die to move input/output (I/O) pads of devices in the die to different locations for improved access or connection. In some existing technologies, the forming of an I/O pad includes forming a trench extending through a first passivation structure, conformally depositing an aluminum-based layer (e.g., Al, AlCu) over the first passivation structure and in the trench, and performing an etching process to etch back the aluminum-based layer to form the I/O pad. However, due to the presence of the trench, after the deposition, a top surface of the portion of the aluminum-based layer formed directly over the trench is lower than a top surface of a remaining portion of the aluminum-based layer that is formed directly over the first passivation structure. That is, the top surface of the aluminum-based layer (i.e., I/O pad) has a recess. A planarization process is not applicable to provide the aluminum-based layer a planar surface since aluminum is intrinsically soft. The uneven top surface of the aluminum-based layer limits possible landing sites of bonding structures that will be formed thereon and thus increases the difficulty of furthering scaling down the geometry size of the IC chip. In addition, unsatisfactory etching selectivity among the I/O pad and dielectric layers of a second passivation structure formed over the I/O pad may also lead to damages to or loss of the I/O pad, resulting in increased resistance. Therefore, while existing I/O pads and passivation structures are adequate for their general purposes, they are not satisfactory in all aspects.

The present disclosure provides a semiconductor structure having copper-based metal lines and methods of making the same to address these issues. In an embodiment, after forming a contact via opening extending through a first passivation structure, a seed layer is formed over and in the contact via, and a copper-based metal layer (e.g., Cu) is formed over the seed layer by electro-chemical plating (ECP). After forming the copper-based metal layer, a passivation structure including multiple dielectric layers are formed on the copper-based metal layer. An etching process including multiple steps is then performed to form pad access opening. By forming copper-based metal layer using ECP, the top surface of the copper-based metal layer would be planar, and parasitic resistance of the semiconductor structure may be reduced. In addition, the configuration of the passivation structure and the configuration of the etching process allow the top surface of the copper-based metal layer being kept substantially undamaged. As such, the resulting semiconductor structure has better reliability and/or enhanced performance.

The various aspects of the present disclosure will now be described in more detail with reference to the figures. In that regard, FIG. 1 is a flowchart illustrating a method 100 for fabricating a semiconductor structure, according to embodiments of the present disclosure. Method 100 is described below in conjunction with FIGS. 2-19 and 27, which are fragmentary cross-sectional views of a semiconductor structure 200 at different stages of fabrication according to embodiments of method 100; FIG. 20 is a flowchart illustrating a method 1000 for fabricating a semiconductor structure, according to embodiments of the present disclosure. Method 1000 is described below in conjunction with FIGS. 21-26, which are fragmentary cross-sectional views of a semiconductor structure 2000 at different stages of fabrication according to embodiments of method 1000.

Methods 100 and 1000 are merely examples and are not intended to limit the present disclosure to what is explicitly illustrated therein. Additional steps can be provided before, during, and after method 100 and/or method 1000, and some steps described can be replaced, eliminated, or moved around for additional embodiments of the method. Not all steps are described herein in detail for reasons of simplicity. Additionally, throughout the present application, like reference numerals denote like features, unless otherwise excepted.

Figure 2:
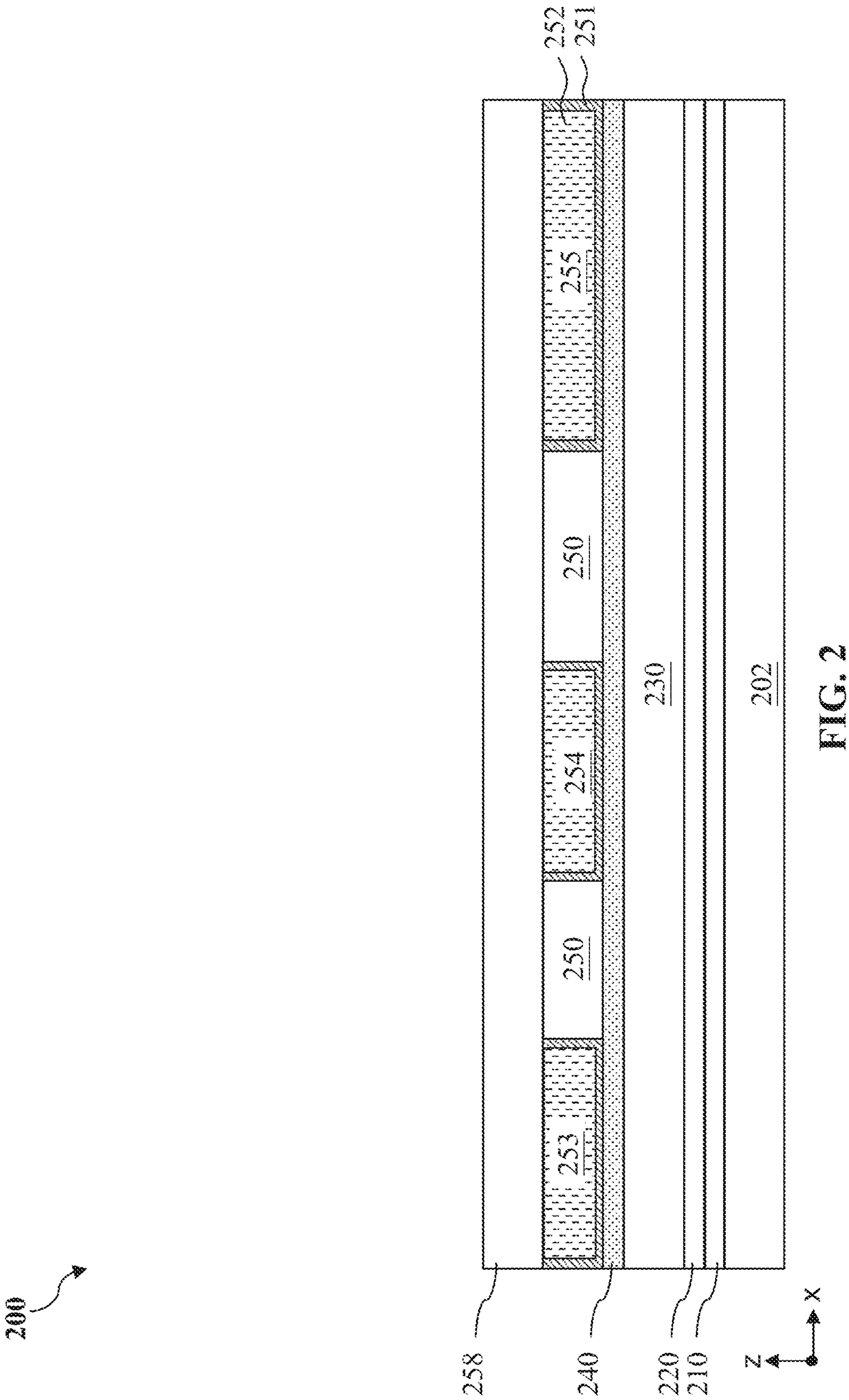
FIGS. 2, 3, 4, 5, 6, 7, 8, 9, 10, 11, 12, 13, 14, 15, 16, 17, 18, and 19 are fragmentary cross-sectional views of a semiconductor structure during various fabrication stages in the method of FIG. 1, according to various aspects of the present disclosure.

Referring to FIGS. 1 and 2, method 100 includes a block 102 where a semiconductor structure 200 is provided. The semiconductor structure 200 includes a substrate 202, which may be made of silicon or other semiconductor materials such as germanium. The substrate 202 may also include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, such as an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Source/drain feature(s) may refer to a source or a drain, individually or collectively dependent upon the context. Transistors formed on the substrate 202 may be planar devices or multi-gate devices. Multi-gate devices include, for example, fin-like field effect transistors (FinFETs) or multi-bridge-channel (MBC) transistors. A FinFET has an elevated channel wrapped by a gate on more than one side (for example, the gate wraps a top and sidewalls of a “fin” of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The semiconductor structure 200 also includes a multi-layer interconnect (MLI) structure 210, which provides interconnections (e.g., wiring) between the various microelectronic components of the semiconductor structure 200. The MLI structure 210 may also be referred to as an interconnect structure 210. The MLI structure 210 may include multiple metal layers or metallization layers. In some instances, the MLI structure 210 may include eight (8) to fourteen (14) metal layers. Each of the metal layers includes multiple conductive components embedded in an intermetal dielectric (IMD) layer. The conductive components may include contacts, vias, or metal lines. The IMD layer may be a silicon oxide or silicon-oxide-containing material where silicon exists in various suitable forms. As an example, the IMD layer includes silicon oxide or a low-k dielectric material having k-value (dielectric constant) smaller than that of silicon oxide, which is about 3.9. In some embodiments, the low-k dielectric material includes tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, combinations thereof, or other suitable materials.

In an embodiment, the semiconductor structure 200 also includes a carbide layer 220 deposited on the MLI structure 210. The deposition process includes chemical vapor deposition (CVD), physical vapor deposition (PVD), atomic layer deposition (ALD), or combinations thereof. Any suitable type of carbide material such as silicon carbide (SiC) can be used in the carbide layer 220. In an embodiment, an oxide layer 230 is deposited on the carbide layer 220. Any suitable deposition process for the oxide layer 230 may be used, including CVD, flowable CVD (FCVD), spin-on coating, PVD, ALD, or combinations thereof. In an embodiment, the oxide layer 230 includes undoped silicon oxide.

The semiconductor structure 200 also includes an etch stop layer (ESL) 240 deposited on the oxide layer 230. The ESL 240 may include silicon carbonitride (SiCN), silicon oxycarbide (SiOC), silicon carbide (SiC), silicon oxycarbonitride (SiOCN), or silicon nitride (SIN), or combinations thereof and may be formed by chemical vapor deposition (CVD), physical vapor deposition (PVD), atomic layer deposition (ALD), or combinations thereof.

The semiconductor structure 200 also includes a dielectric layer 250 disposed on the ESL 240. A composition of the dielectric layer 250 may be similar to that of the oxide layer

230. In some embodiments, the dielectric layer 250 includes undoped silica glass (USG) or silicon oxide. The dielectric layer 250 may be deposited using CVD, flowable CVD (FCVD), spin-on coating, PVD, ALD, or combinations thereof.

The semiconductor structure 200 also includes a number of lower contact features (e.g., a lower contact feature 253, a lower contact feature 254, and a lower contact feature 255) formed in the dielectric layer 250. The formation of the lower contact features may include patterning of the dielectric layer 250 to form trenches and deposition of a barrier layer 251 and a metal fill layer 252 in the trenches. In some embodiments, the barrier layer 251 may include titanium nitride or tantalum nitride and may be conformally deposited using PVD, CVD, metalorganic CVD (MOCVD), or a suitable method. In one embodiment, the barrier layer 251 may include tantalum nitride. The metal fill layer 252 includes a metal or metal alloy such as copper (Cu), cobalt (Co), nickel (Ni), tungsten (W), ruthenium (Ru), titanium (Ti), or combinations thereof. After the barrier layer 251 and the metal fill layer 252 are deposited, a planarization process, such as a chemical mechanical planarization (CMP) process, may be performed to remove excess portions of barrier layer 251 and metal fill layer 252 outside of the trenches to form the lower contact features 253, 254 and 255. In an embodiment, the metal fill layer 252 includes copper. Although the lower contact features 253, 254, and 255 are disposed below upper contact features (such as contact pads 284A and 284B), the lower contact features 253, 254, and 255 are sometimes referred to as top metal (TM) contacts 253, 254, and 255, respectively.

The semiconductor structure 200 also includes a first passivation layer 258 formed over the dielectric layer 250. In an embodiment, the first passivation layer 258 is deposited on the dielectric layer 250 by performing chemical vapor deposition (CVD), physical vapor deposition (PVD), atomic layer deposition (ALD), or combinations thereof. The first passivation layer 258 may include silicon carbonitride, silicon nitride, other suitable materials, or combinations thereof. In an embodiment, the first passivation layer 258 is in direct contact with top surfaces of the lower contact features 253, 254, and 255 and includes silicon nitride.

Figure 3:
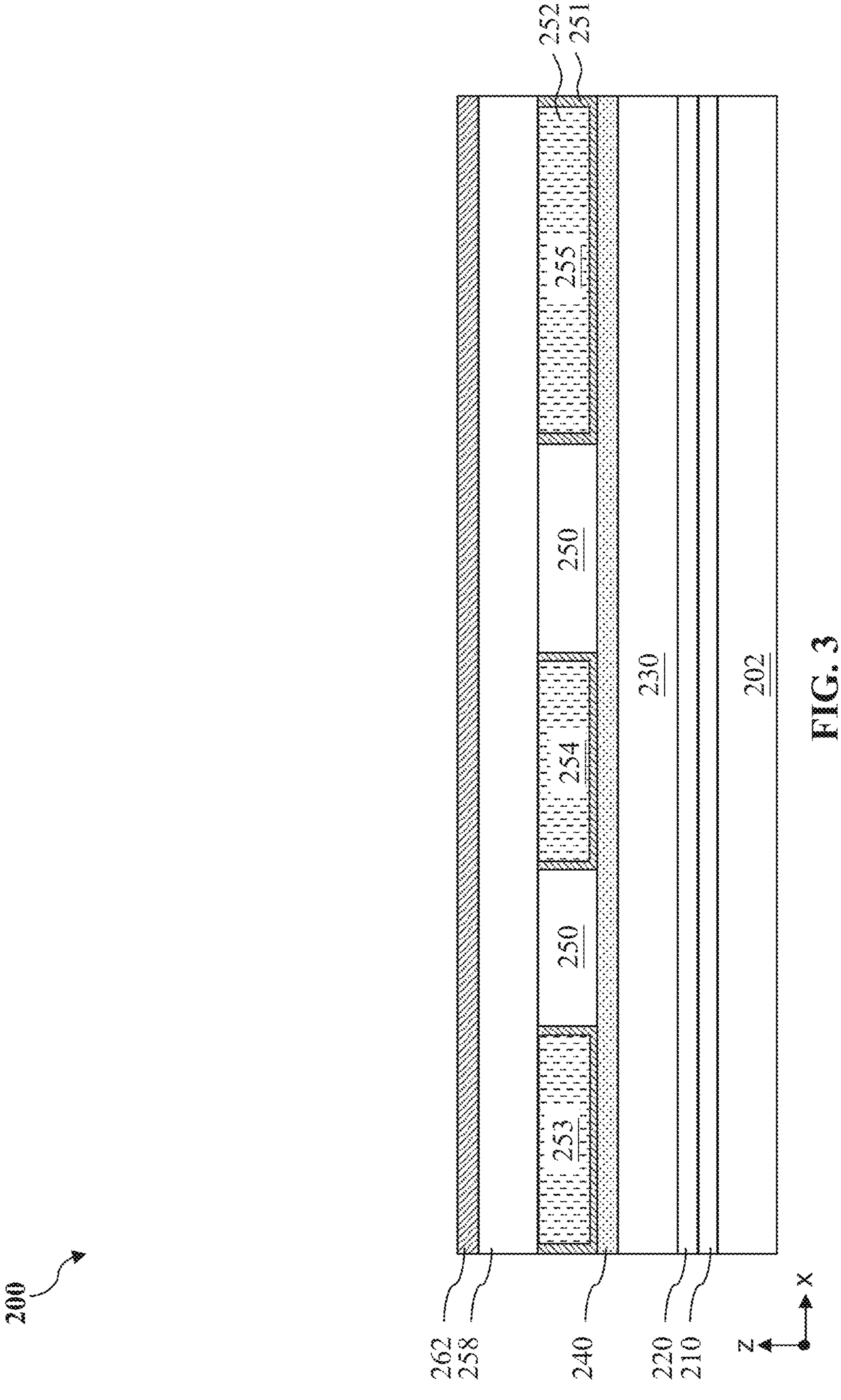

Referring to FIGS. 1 and 3-7, method 100 includes a block 104 where a metal-insulator-metal (MIM) capacitor 272 (shown in FIG. 7) is formed over the first passivation layer 258. As shown in FIGS. 3-7, forming the MIM capacitor 272 involves multiple processes, including those for formation and patterning of a bottom conductor plate 262*a*, a middle conductor plate 266, and a top conductor plate 270*a*. Referring first to FIG. 3, a first conductive layer 262 is formed directly on the first passivation layer 258. The first conductive layer 262 may be deposited on the first passivation layer 258 using PVD, CVD, or MOCVD. In some embodiments, the first conductive layer 262 may include titanium (Ti), tantalum (Ta), titanium nitride (TiN), tantalum nitride (TaN), copper (Cu), cobalt (Co), nickel (Ni), tungsten (W), aluminum (Al), or other suitable materials. The first conductive layer 262 may cover an entire top surface of the semiconductor structure 200.

Figure 4:
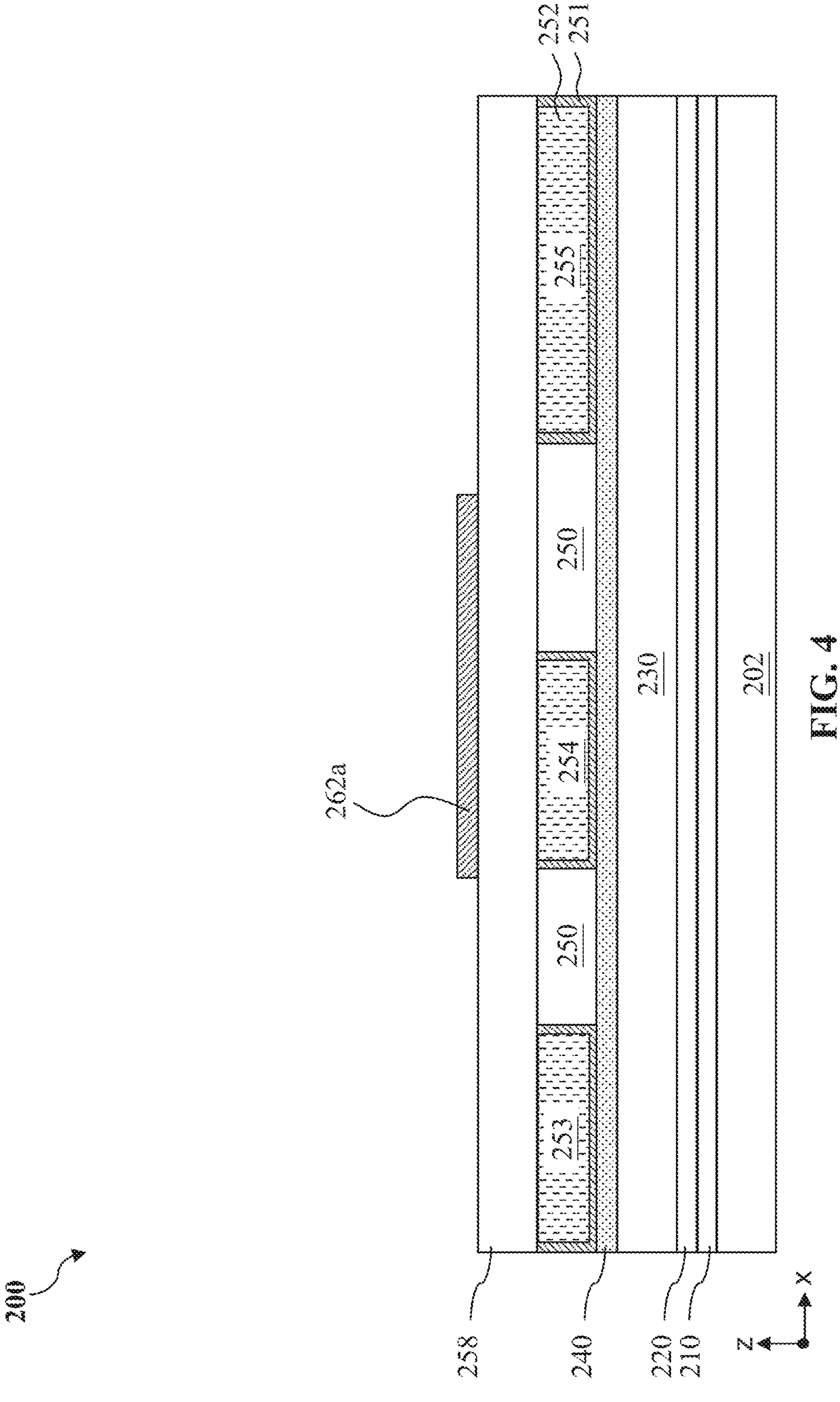
Figure 5:
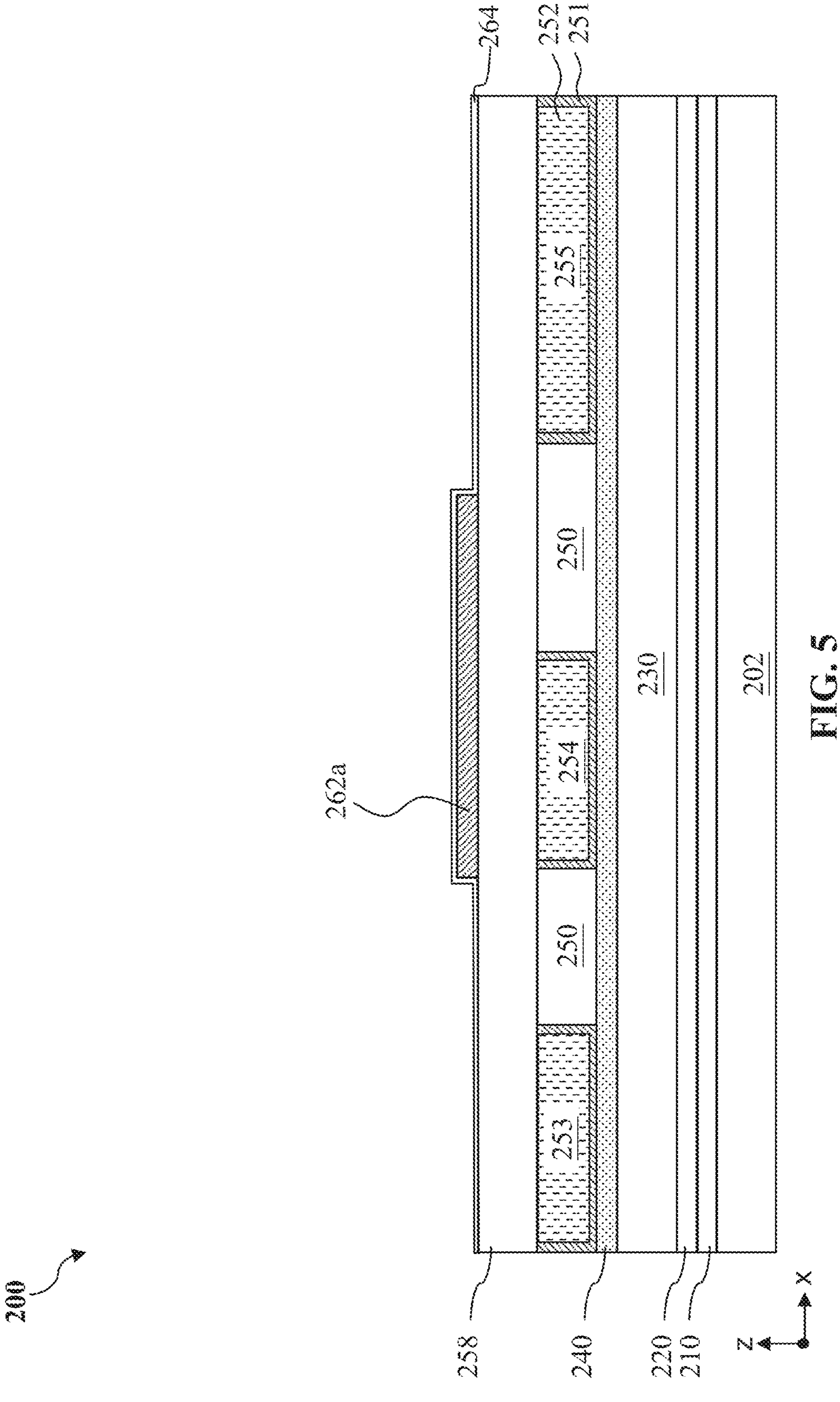

With reference to FIG. 4, the first conductive layer 262 is patterned to form a bottom conductor plate 262*a* disposed directly over the lower contact feature 254. The patterning may include deposition of a hard mask layer over the first conductive layer 262, formation of a photoresist layer over the hard mask layer, patterning of the photoresist layer using photolithography, etching of the hard mask layer using the patterned photoresist layer as an etch mask, and then etching of the first conductive layer 262 using the patterned hard mask as an etch mask. The hard mask layer may be selectively removed after forming the bottom conductor plate 262*a*. As shown in FIG. 5, after the first conductive layer 262 is patterned to form the bottom conductor plate 262*a*, a first insulator layer 264 is deposited over the semiconductor structure 200. In an embodiment, the first insulator layer 264 is conformally deposited to have a generally uniform thickness over the top surface of the semiconductor structure 200 (e.g., having about the same thickness on top and sidewall surfaces of the bottom conductor plate 262*a*). The first insulator layer 264 may be deposited using CVD, ALD, or a suitable deposition method and may be a high-k dielectric layer that includes hafnium oxide, aluminum oxide, zirconium oxide, titanium oxide, tantalum oxide, or a combination thereof.

Figure 6:
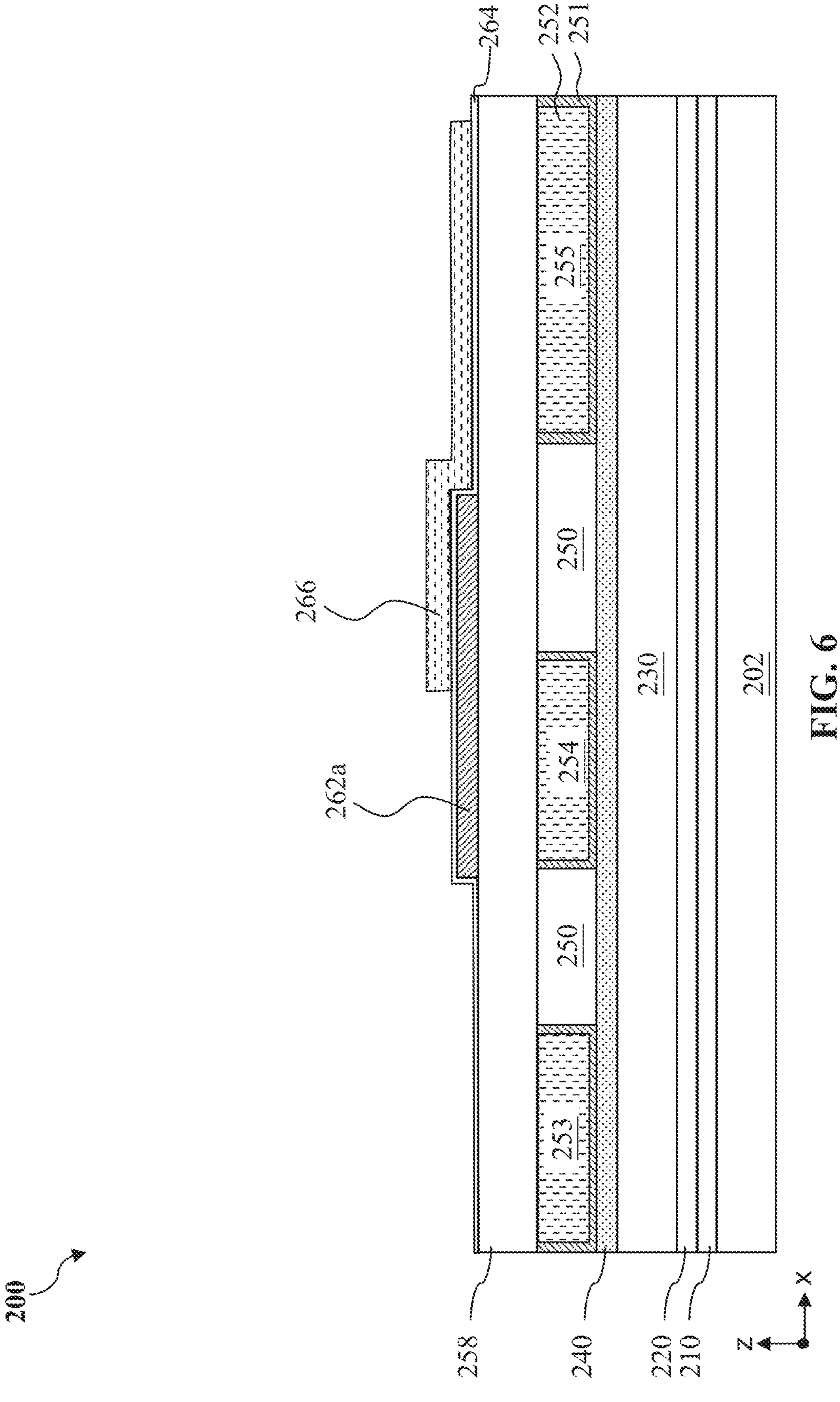
Figure 7:
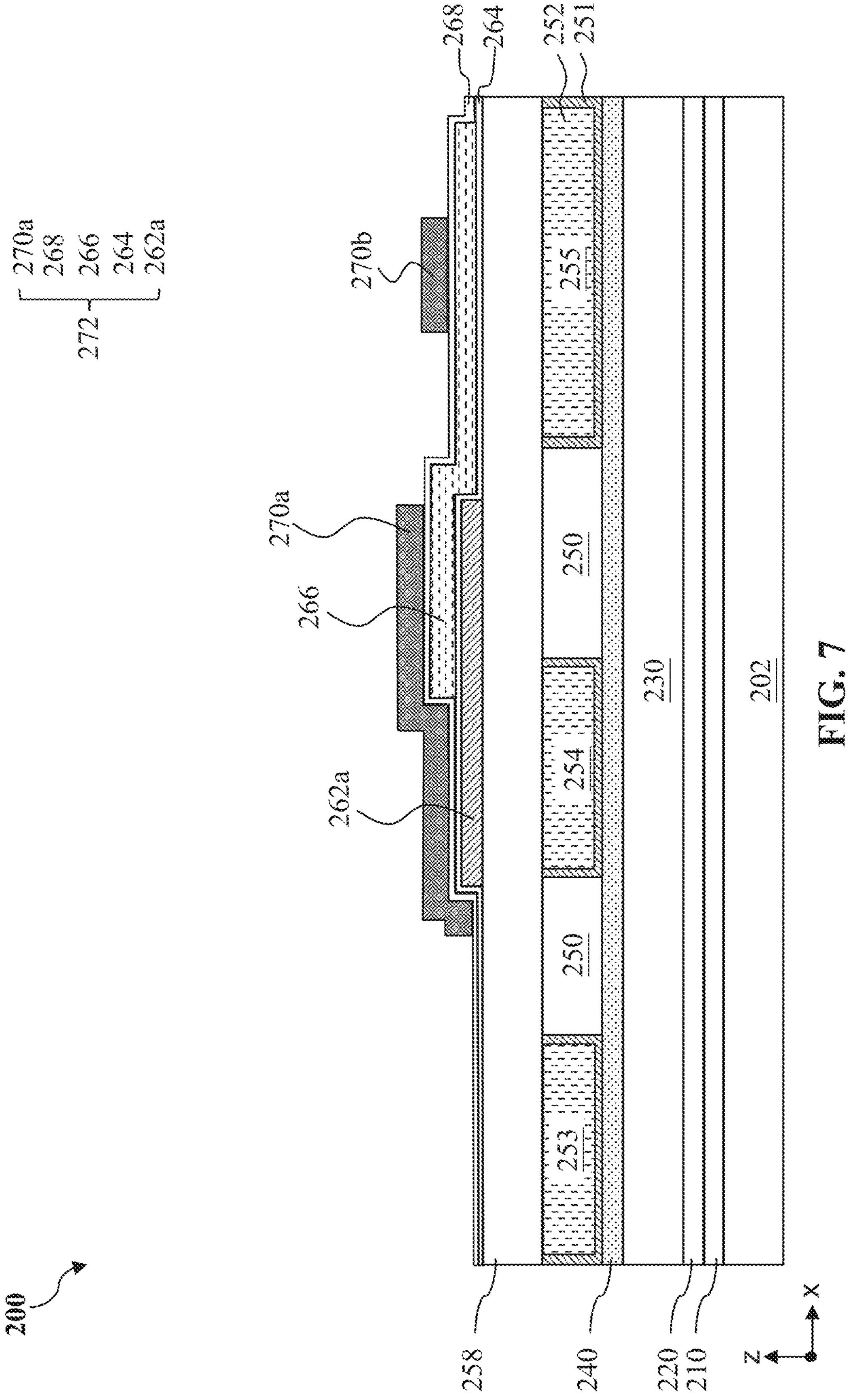

With reference to FIG. 6, a middle conductor plate 266 is formed on the first insulator layer 264 and over the lower contact feature 255. The middle conductor plate 266 is vertically overlapped with the bottom conductor plate 262*a*. Composition and formation of the middle conductor plate 266 may be similar to those of the bottom conductor plate 262*a*. With reference to FIG. 7, a second insulator layer 268 is then conformally formed over the semiconductor structure 200, including over the middle conductor plate 266. Composition and formation of the second insulator layer 268 may be similar to those of the first insulator layer 264. Still referring to FIG. 7, a top conductor plate 270*a* and a dummy conductor plate 270*b* are formed over the second insulator layer 268. The top conductor plate 270*a* is vertically overlapped with the bottom conductor plate 262*a*, and the dummy conductor plate 270*b* is vertically overlapped with the middle conductor plate 266. Formation and composition of the conductor plates 270*a* and 270*b* may be similar to those of the bottom conductor plate 262*a*, and repeated description is omitted for reason of simplicity. After the formation of the top conductor plate 270*a*, the structure of a MIM capacitor 272 is finalized. It is understood that the MIM capacitor 272 may have different configurations. For example, the MIM capacitor 272 may include other suitable number of conductor plates (e.g., two, four, or more), and each two adjacent conductor plates are isolated by a corresponding insulator layer.

Figure 8:
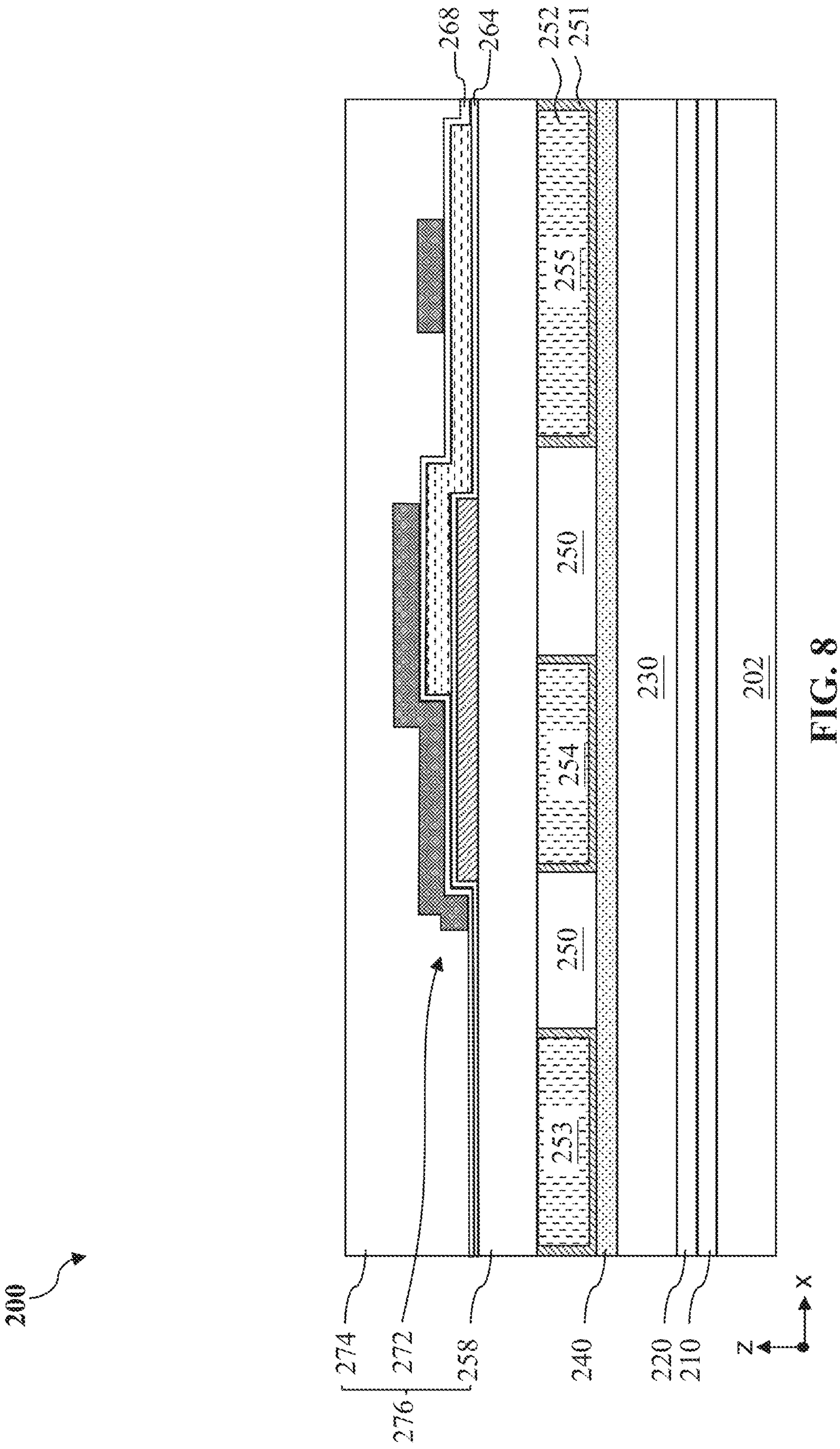

Referring to FIGS. 1 and 8, method 100 includes a block 106 where a second passivation layer 274 is formed over the MIM capacitor 272. In some embodiments, the second passivation layer 274 may include a dielectric layer or two or more dielectric layers formed by any suitable materials such as silicon nitride and may be formed by any suitable deposition processes (e.g., plasma-enhanced chemical vapor deposition (PECVD), ALD). In an embodiment, the second passivation layer 274 includes silicon nitride. A planarization process (e.g., chemical mechanical polishing CMP) is performed after the deposition of the second passivation layer 274 to provide the second passivation layer 274 a planar top surface. As shown in FIG. 8, the MIM capacitor 272 is sandwiched between the planarized second passivation layer 274 and first passivation layer 258. In some embodiments, the first passivation layer 258, the MIM capacitor 272, and the planarized second passivation layer 274 may be collectively referred to as a first passivation structure 276. The first passivation layer 258 and the second passivation layer 267 protect the MIM capacitor 272 from damages due to stress or crack propagation. It should be noted that methods and structures of the present disclosure also apply to structures that do not include the MIM capacitor 272. That is, the first passivation structure 276 may do not include an MIM capacitor.

Figure 9:
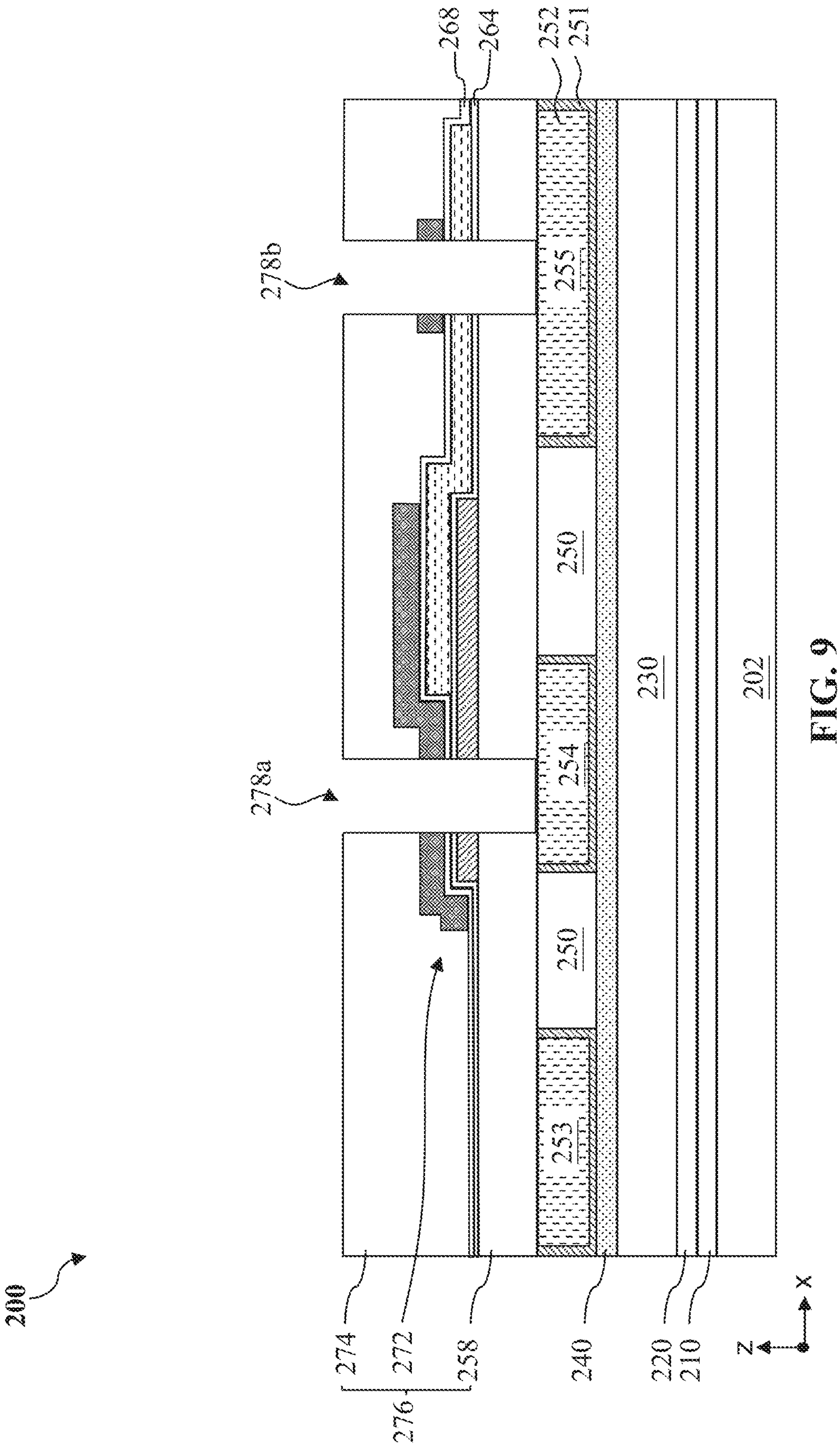

Referring to FIGS. 1 and 9, method 100 includes a block 108 where a number of via openings (such as via openings 278*a* and 278*b*) are formed to penetrate through the first passivation structure 276. In the depicted embodiment, the via opening 278*a* extends through the bottom conductor plate 262*a* and the top conductor plate 270*a* of the MIM capacitor 272 and exposes the lower contact feature 254. The via opening 278*b* extends through the dummy conductor plate 270*b* and the middle conductor plate 266 and exposes the lower contact feature 255. The formation of the via openings (such as via openings 278*a* and 278*b*) involves performing a combination of lithography and etching processes. In an embodiment, the via openings 278*a* and 278*b* may be formed using dry etching, such as reactive ion etching (RIE). In some embodiments, the formation of the via openings 278*a* and 278*b* may include use of oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 10:
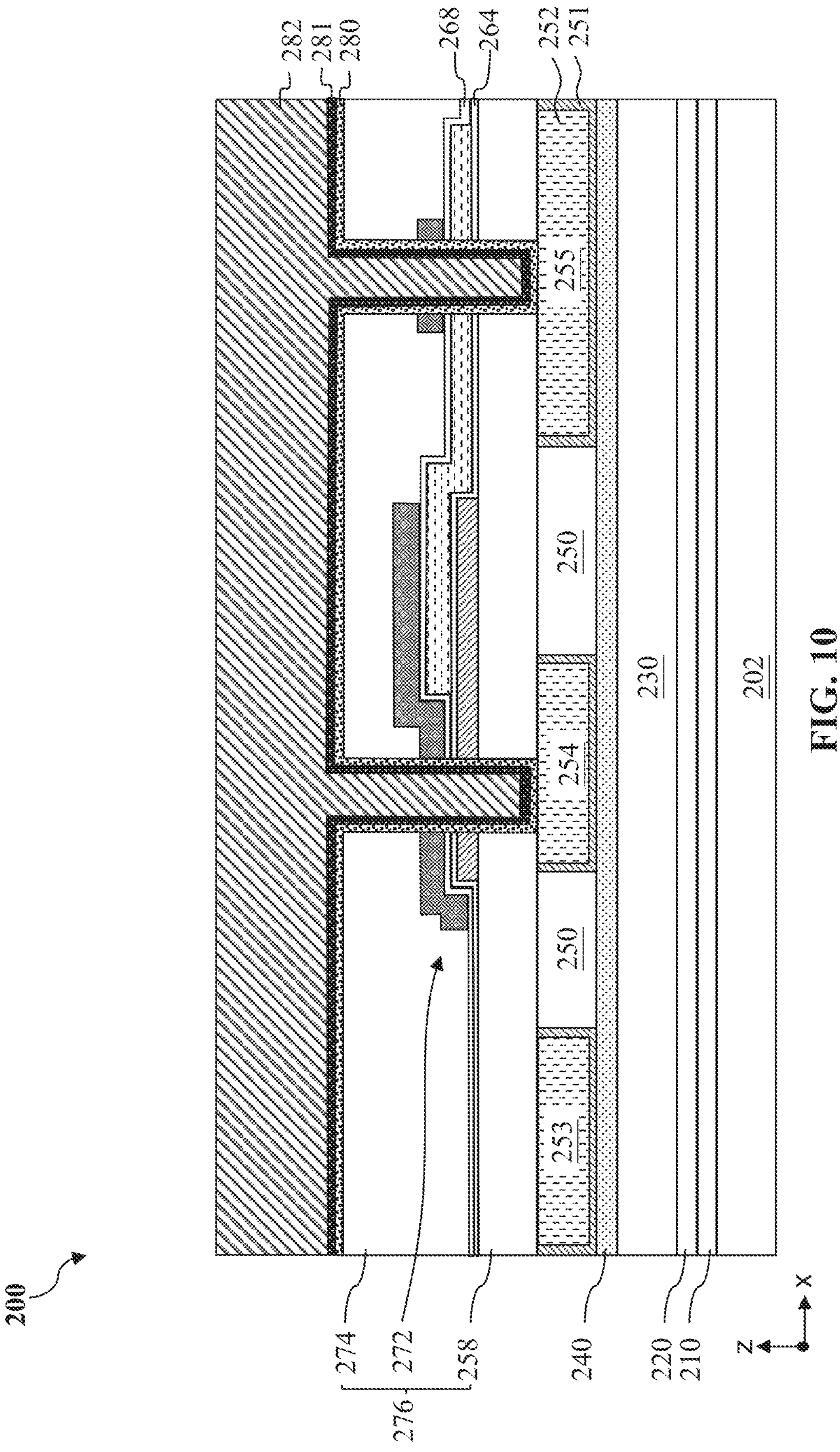

Referring to FIGS. 1 and 10, method 100 includes a block 110 where a barrier layer 280 is conformally deposited over the semiconductor structure 200 and a seed layer 281 is conformally deposited on the barrier layer 280. The barrier layer 280 and the seed layer 281 are conformally deposited over the first passivation structure 276 and into the via openings 278*a* and 278*b* using a suitable deposition technique, such as ALD, PVD or CVD. The barrier layer 280 may include titanium nitride (TiN), tantalum nitride (TaN), or another metal nitride, and the seed layer 281 may include copper (Cu). The barrier layer 280 and the seed layer 281 partially fill the via openings 278*a* and 278*b*.

Figure 11:
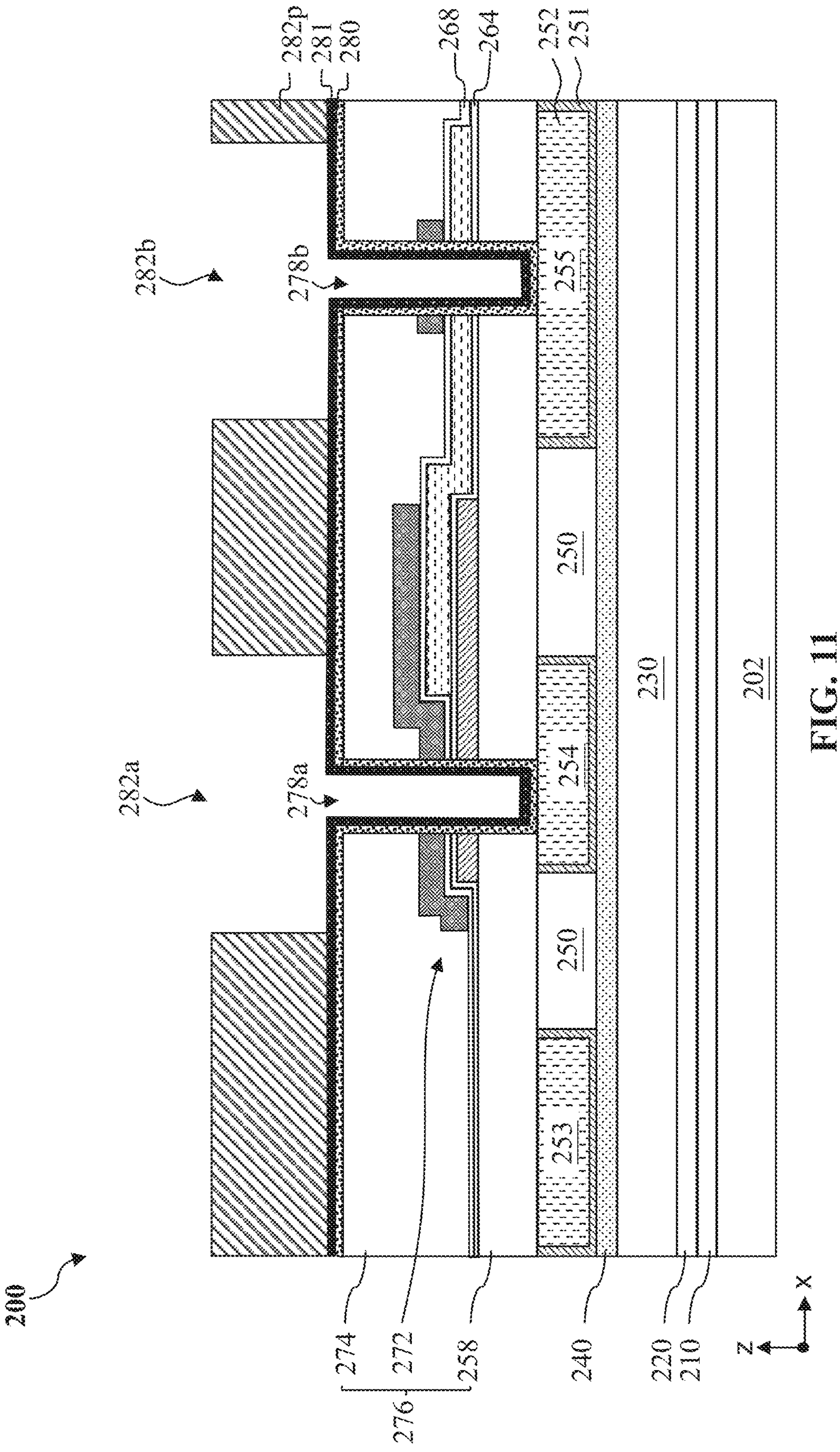

Referring to FIGS. 1 and 10-11, method 100 includes a block 112 where a protective layer 282 is formed over the semiconductor structure 200 and patterned to form openings exposing portions of the barrier layer 280 and seed layer 281 formed in the via openings (such as the via openings 278*a* and 278*b*). Referring first to FIG. 10, the protective layer 282 is formed over the semiconductor structure 200. In an embodiment, the protective layer 282 includes a photoresist layer. The photoresist layer may be blanketly deposited over the semiconductor structure 200 using spin-on coating. That is, the photoresist layer is formed in and over the via openings (such as the via openings 278*a* and 278*b*). Referring then to FIG. 11, photolithography techniques (e.g., exposure, developing) are used to pattern the protective layer 282. The patterned protective layer 282 may be referred to as the patterned protective layer 282*p*. As depicted in FIG. 11, in the present embodiments, the patterned protective layer 282*p* defines an opening 282*a* exposing portions of the seed layer 281 formed in and adjacent to the via opening 278*a* and an opening 282*b* exposing portions of the seed layer 281 formed in and adjacent to the via opening 278*b*.

Figure 12:
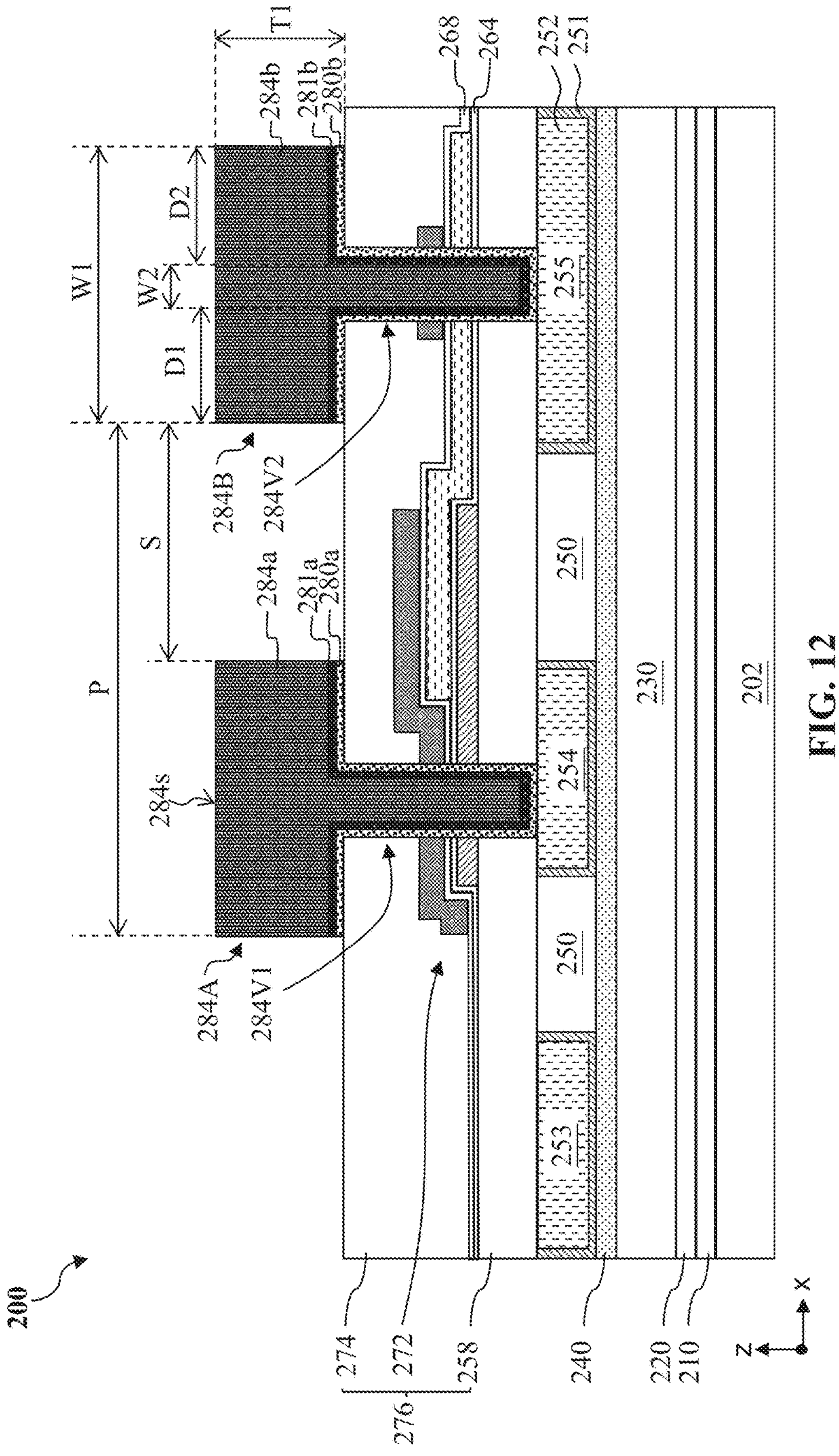

Referring to FIGS. 1 and 12, method 100 includes a block 114 where metal layers 284*a* and 284*b* are formed in and over the via openings 278*a* and 278*b*, respectively, and over the seed layer 281. In the present embodiments, while using the patterned protective layer 282 as a mask, an electro-chemical plating (ECP) process is carried out to form the metal layer 284*a* in the via opening 278*a* and the metal layer 284*b* in the via opening 278*b*. As described above, aluminum is intrinsically soft and may not be planarized to provide a planar top surface. In the present embodiment, to form a substantially planar top surface while reducing a parasitic resistance between bonding structures (e.g., bonding structures including the metal pillar 296) and the top metal contacts (e.g., the top metal contacts 254 and 255), the metal layers 284*a* and 284*b* include, for example, pure elemental copper, copper containing unavoidable impurities, or copper alloys containing minor amounts of elements such as tantalum, indium, tin, zinc, manganese, chromium, titanium, germanium, strontium, platinum, magnesium, aluminum or zirconium. In an embodiment, the metal layer 284*a*/284*b* is substantially a layer including pure elemental copper. The plating solution for electro-chemical plating (ECP) process may include, e.g., copper sulfate, and may have additives such as bis(3-sulfopropyl) disulfide, polyethylene glycol, gelatin, sodium dodecyl sulfate, polyacrylic acid, and/or glycerol. Upon completion of the ECP process, top surfaces 284*s* of the metal layers 284*a* and 284*b* are substantially planar. In some embodiments, the metal layers 284*a* and 284*b* may include vertical sidewalls.

After the formation of the metal layers 284*a* and 284*b*, the patterned protective layer 282*p* is selectively removed, for example, by ashing or selective etching. An etching process may be then performed to selectively remove portions of the barrier layer 280 and seed layer 281 not covered by the metal layers 284*a* and 284*b*. Portions of the barrier layer 280 and seed layer 281 covered by the metal layer 284*a* may be referred to as barrier layer 280*a* and seed layer 281*a*, respectively; and portions of the barrier layer 280 and seed layer 281 covered by the metal layer 284*b* may be referred to as barrier layer 280*b* and seed layer 281*b*, respectively. Portions of the barrier layer 280*a*, seed layer 281*a* and metal layer 284*a* formed over the first passivation structure 276 may be collectively referred to as a contact pad 284A; and portions of the barrier layer 280*b*, seed layer 281*b* and metal layer 284*b* formed over the first passivation structure 276 may be collectively referred to as a contact pad 284B. Portions of the barrier layer 280*a*, seed layer 281*a* and metal layer 284*a* formed in the via openings 278*a* may be collectively referred to as a contact via 284V1; and portions of the barrier layer 280*b*, seed layer 281*b* and metal layer 284*b* formed over the first passivation structure 276 may be collectively referred to as another contact via 284V2. In some embodiments, the contact pads (such as contact pads 284A-284B) may be referred to as upper contact features and may be part of a redistribution layer (RDL) to reroute bond connections between upper and lower layers.

Each of the contact pads 284A and 284*b* has a thickness T1 along the Z direction. In some embodiments, the thickness T1 may be in a range between 25 kÅ and 30 kÅ. The two adjacent contact pads 284A and 284B are spaced by a distance S that is in a range between about 1 μm and 2 um. Pitch (denoted as P in FIG. 12) of the contact pads 284A and 284B may be in a range between about 3 μm and 8 μm. The contact pad 284A/284*b* has a width W1 (i.e., W2+D1+D2) along the X direction, the contact via 284V1/284V2 has a width W2 along the X direction, in some embodiments, a ratio of the width W2 to the width W1 is no less than 0.5. In an embodiment, the width W2 is greater than 0.8 um. A central line of the contact via 284V1/284V2 may be substantially aligned with a central line of the contact pad 284A/284*b*. That is, a distance D1 between the contact via 284V1/284V2 and one sidewall of the contact pad 284A/284*b* is substantially equal to a distance D2 between the contact via 284V1/284V2 and an opposite sidewall of the contact pad 284A/284*b*. In some embodiments, both the distance D1 and the distance D2 are greater than 0.4 um.

Figure 13:
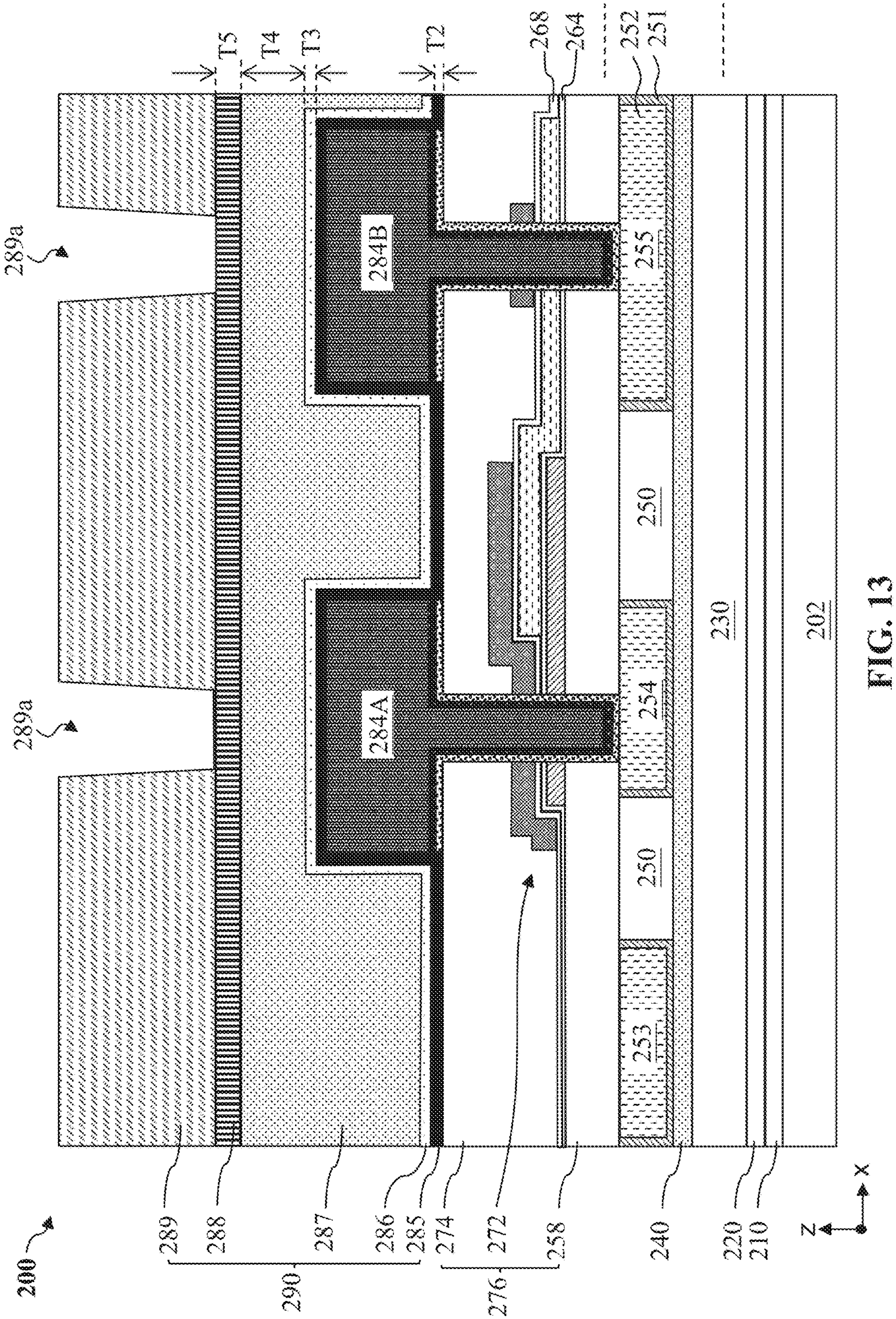

Referring to FIGS. 1 and 13, method 100 includes a block 116 where a second passivation structure 290 is formed over the metal layers 284*a*-284*b* of the contact pads 284A-284B. In the present embodiment, the second passivation structure 290 is a multi-layer structure formed over the first passivation structure 276. Forming the second passivation structure 290 involves multiple processes. With reference to FIG. 13, after forming the contact pads 284A-284B, a first etch stop layer 285 is conformally deposited to have a generally uniform thickness T2 over the top surface of the semiconductor structure 200 (e.g., having about the same thickness on top and sidewall surfaces of the first contact pads 284A-284B), including in openings between two adjacent contact pads. The first etch stop layer 285 may protect the top surfaces of the contact pads 284A and 284B from being oxidized during the formation of other layers (e.g., the oxide liner 286 and the oxide layer 287) of the second passivation structure 290 and also protect the top surfaces 284*s* of the contact pads 284A and 284B from being damaged during the formation of bonding structures thereon. The thickness T2 may be in a range between about 0.75 kÅ and about 2.25 kÅ. If the thickness T2 is less than 0.75 kÅ, the first etch stop layer 285 may be penetrated through so quick that the top surfaces of the contact pads 284A-284B may be inevitably damaged. If the thickness T2 is greater than 2.25 kÅ, space for forming other dielectric layers (e.g., the oxide layer 287) between two adjacent contact pads 284A-284B may be too small, leading to an increased parasitic capacitance, increased difficulty of furthering scaling down the geometry size of the IC chip, increased risk of undergoing cracks due to stress. The first etch stop layer 285 may be a nitride layer (e.g., silicon nitride) and may be formed using suitable methods such as CVD or ALD.

After forming the first etch stop layer 285, the formation of the second passivation structure 290 proceeds to conformally depositing an oxide liner 286 over the first etch stop layer 285, including in the space between two adjacent contact pads (e.g., the contact pads 284A and 284B). The oxide liner 286 includes undoped silica glass (USG) or silicon oxide and may be formed using suitable methods such as CVD or ALD. The oxide liner 286 may have a uniform thickness T3 that is a range between about 1.5 kÅ and about 2.5 kÅ. In an embodiment, the thickness T3 is greater than the thickness T2. An oxide layer 287 is then formed over the oxide liner 286 to fill the rest of the space between two adjacent contact pads 284A-284B. The oxide layer 287 may be formed using high-density plasma (HDP) deposition. A planarization process (e.g., CMP) may be performed to the semiconductor structure 200 to provide a planar top surface. In this depicted embodiment, after the planarization process, the oxide layer 287 has a planar top surface that is above top surfaces of the contact pads 284A-284B. In an embodiment, a thickness T4 of the portion of the oxide layer 287 that is disposed directly over the contact pads 284A-284B is in a range between about 5 kÅ and about 9 kÅ.

Still referring to FIG. 13, forming the second passivation structure 290 also includes forming a second etch stop layer 288 on the oxide layer 287. In an embodiment, the second etch stop layer 288 is conformally deposited to have a generally uniform thickness T5 over the top surface of the semiconductor structure 200. The thickness T5 may be in a range between about 5 kÅ and about 9 kÅ. The second etch stop layer 288 may be a nitride layer (e.g., silicon nitride) and may be formed using suitable methods such as CVD or ALD. After forming the second etch stop layer 288, the formation of the second passivation structure 290 proceeds to forming a passivation layer 289 on the second etch stop layer 288. The passivation layer 289 may be a polymer layer (e.g., polyimide) and may be deposited using spin-on coating. In the present embodiments, the second passivation structure 290 has five layers including, from bottom to top, the first etch stop layer 285, the oxide liner 286, the oxide layer 287, the second etch stop layer 288, and the passivation layer 289. In the present embodiments, after deposition, the passivation layer 289 is then patterned using photolithography. The patterned passivation layer 289 may also serve as an etch mask during subsequent etching processes. In this illustrated example, the patterned passivation layer 289 has two openings 289*a* exposing portions of the second etch stop layer 288.

Figure 14:
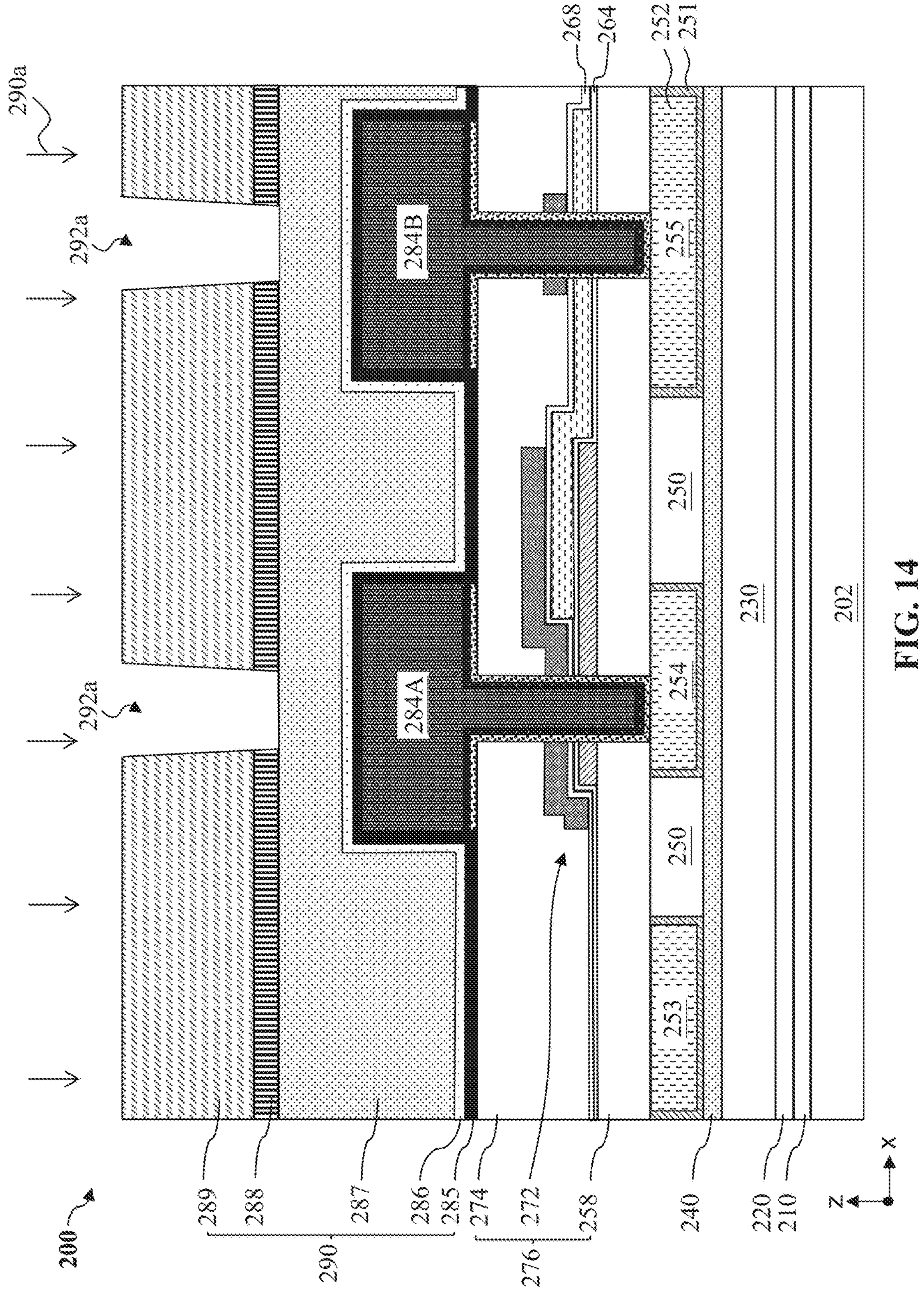

Referring to FIGS. 1 and 14, method 100 includes a block 118 where a first etching process 290*a* is performed to vertically extend the opening 289*a*. For case of description, the vertically extended opening 289*a* after the performing of the first etching process 290*a* is referred to as the opening 292*a*. While using the patterned passivation layer 289 as an etch mask, the first etching process 290*a* is performed to transfer a pattern defined by the patterned passivation layer 289 to the second etch stop layer 288 by removing portion(s) of the second etch stop layer 288 not covered by the patterned passivation layer 289 to form the opening(s) 292*a*. That is, the opening 292*a* also extends through the second etch stop layer 288 of the second passivation structure 290.

In an embodiment, the first etching process 290*a* includes an anisotropic dry etch that exposes the patterned passivation layer 289 and portions of the second etch stop layer 288 to a fluorine-containing etch gas. The fluorine-containing etch gas may include tetrafluoromethane ($CF_4$) and/or other suitable fluorine-containing etch gas constituent(s) (e.g., $C_4F_8$, $CH_4$, $NF_3$, $SF_6$, $C+F_6$). The fluorine-containing etch gas may also include argon (Ar) or other suitable gases. In an embodiment, the anisotropic dry etch of the first etching process 290*a* is a fluorocarbon plasma etch, such as a $CF_4$ plasma etch. The first etching process 290*a* stops once the second etch stop layer 288 is penetrated through. In an embodiment, the first etching process 290*a* is performed at a RF source power that is greater than 1000 W for providing satisfactory plasma density and at a bias power that is greater about 500 W for providing a satisfactory anisotropic etching. In some embodiments, the performing of the first etching process 290*a* may also slightly reduce a height of the patterned passivation layer 289.

Figure 15:
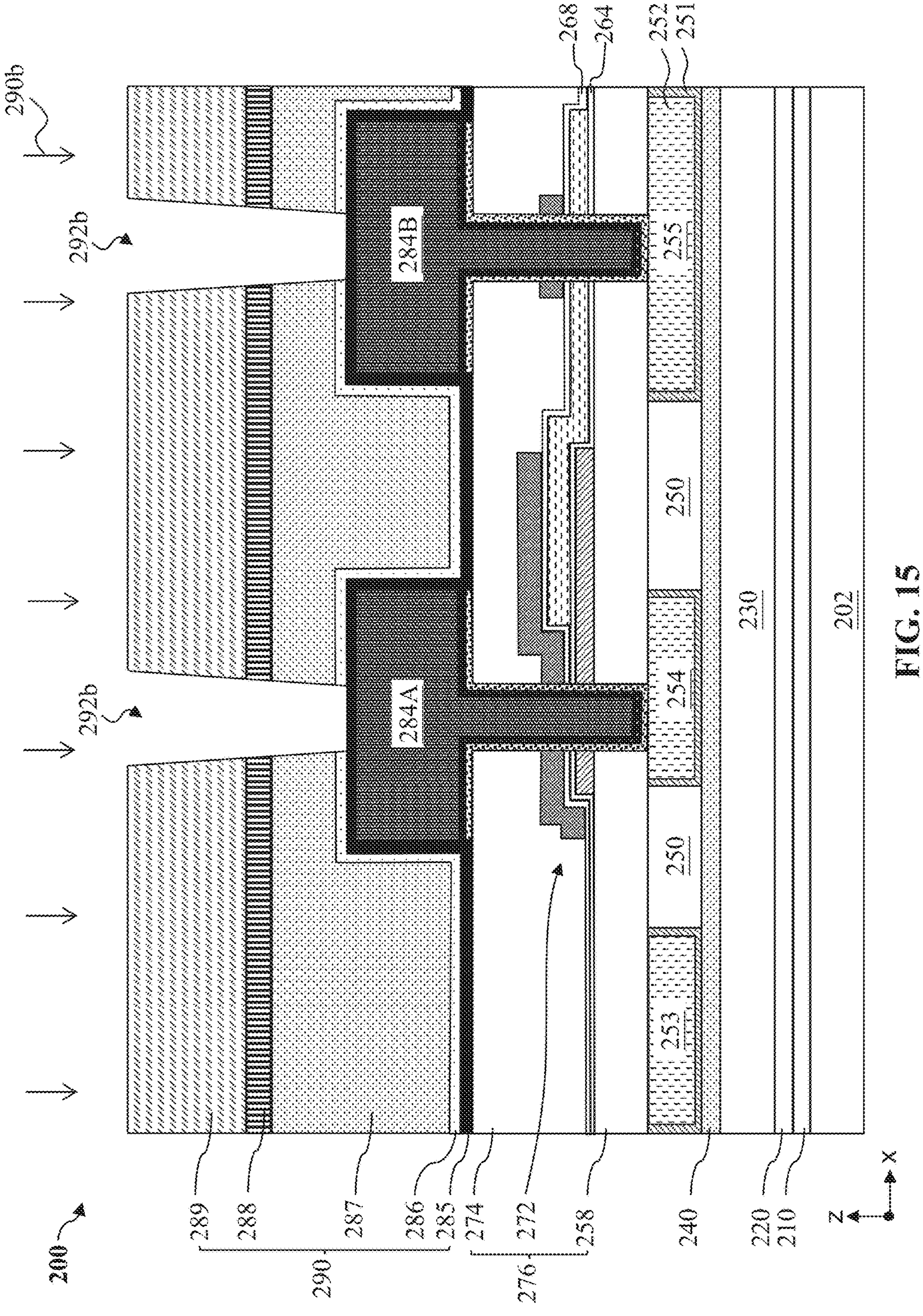

Referring to FIGS. 1 and 15, method 100 includes a block 120 where a second etching process 290*b* is performed to etch the oxide layer 287 and the oxide liner 286 to vertically extend the opening 292*a*. While using the patterned passivation layer 289 as an etch mask, the second etching process 290*b* is performed to further etch the oxide layer 287 and the oxide liner 286 to vertically extend the opening 292*a*. For ease of description, the vertically extended opening 292*a* after the performing of the second etching process 290*b* is referred to as the opening 292*b*. As depicted by FIG. 15, the opening 292*b* exposes a portion of a top surface of the first etch stop layer 285 disposed on the contact pad (e.g., the contact pad 284A or the contact pad 284B).

In an embodiment, the second etching process 290*b* includes an anisotropic dry etch that exposes the oxide layer 287 to a fluorine-containing etch gas. In an embodiment, the fluorine-containing etch gas includes a combination of $C_4F_8$ and $CH_4$. In some other embodiments, the fluorine-containing etch gas may include $CF_4$, $NF_3$, $SF_6$, $C_4F_6$ and/or other suitable fluorine-containing etch gas constituent(s). The fluorine-containing etch gas may also include argon (Ar), helium (He), and/or other suitable gases. In an embodiment, the anisotropic dry etch of the second etching process 290*b* is a fluorocarbon plasma etch and it stops once the oxide liner 286 is penetrated through and the top surface of the portion of the first etch stop layer 285 disposed on the contact pad (e.g., the contact pad 284A or the contact pad 284B) is partially exposed. In an embodiment, the source power of the second etching process 290*b* is less than the source power of the first etching process 290*a*. In an embodiment, the second etching process 290*b* is performed at a RF source power that is less than 1000 W and a bias power that is greater about 500 W. In some embodiments, the performing of the second etching process 290*b* may also slightly reduce a height of the patterned passivation layer 289.

Figure 16:
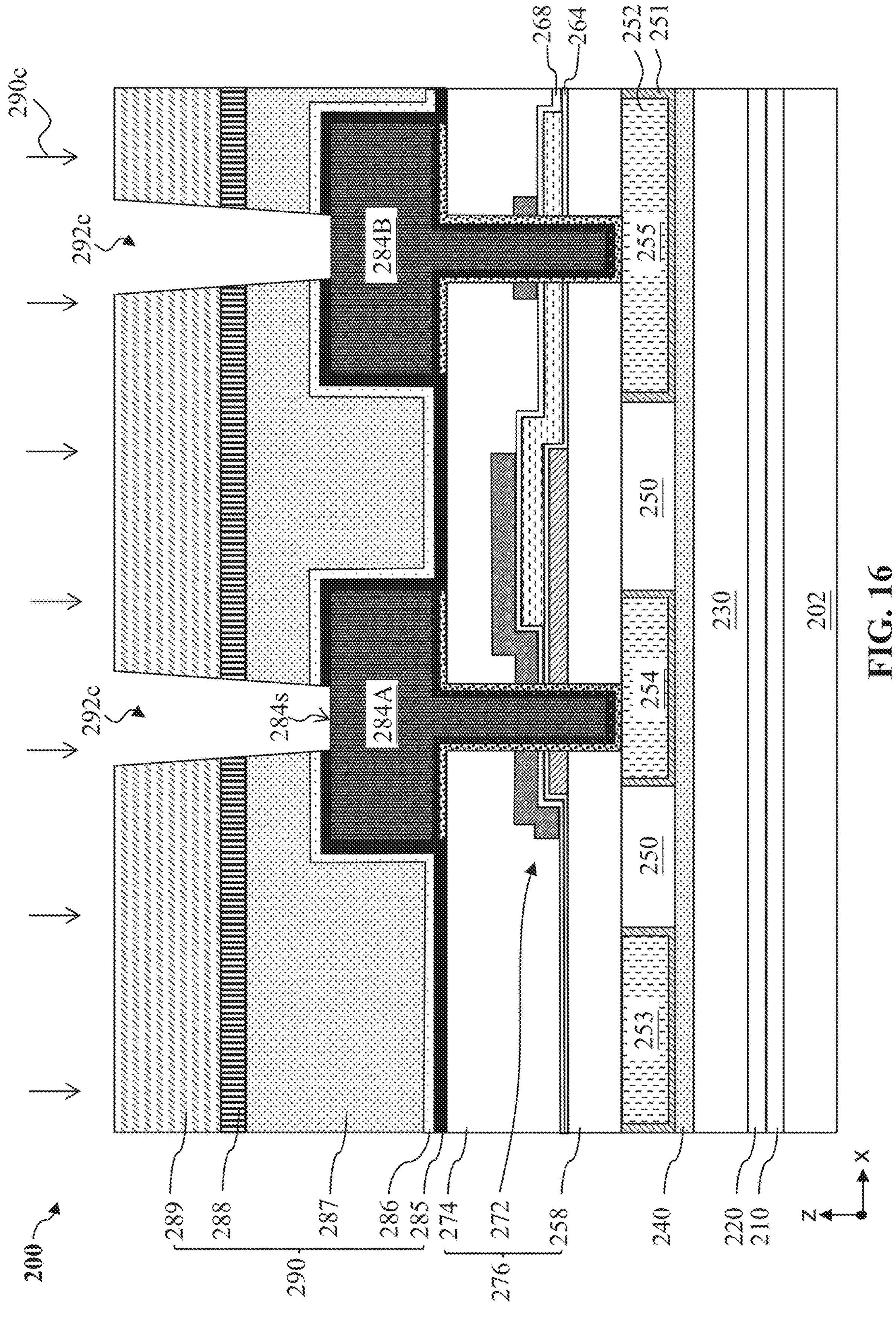

Referring to FIGS. 1 and 16, method 100 includes a block 122 where a third etching process 290*c* is performed to etch the first etch stop layer 285 to vertically extend the opening 292*b* to expose at least a portion of a top surface of the contact pad (e.g., the contact pad 284A/284B). While using the patterned passivation layer 289 as an etch mask, the third etching process 290*c* is performed to etch the first etch stop layer 285 to vertically extend the opening 292*b*. For case of description, the vertically extended opening 292*b* after the performing of the third etching process 290*c* is referred to as the opening 292*c*. As depicted by FIG. 16, the opening 292*c* exposes a portion of a top surface of the contact pad (e.g., the contact pad 284A or the contact pad 284B).

In an embodiment, the third etching process 290*c* includes an anisotropic dry etch that exposes the first etch stop layer 285 to a fluorine-containing etch gas. In an embodiment, the fluorine-containing etch gas includes a combination of $CF_4$ and $CH_4$. In some other embodiments, the fluorine-containing etch gas may include $C_4F_8$, $NF_3$, $SF_6$, $C_4F_6$ and/or other suitable fluorine-containing etch gas constituent(s). The fluorine-containing etch gas may also include argon (Ar). In an embodiment, the anisotropic dry etch of the third etching process 290*c* is a fluorocarbon plasma etch and it stops once the first etch stop layer 285 is penetrated through. In an embodiment, the third etching process 290*c* is performed at a RF source power that is lower than the RF source power of the first etching process 290*a*. That is, a plasma density of the third etching process 290*c* is less than a plasma density of the first etching process 290*a*. In an embodiment, the RF source power of the third etching process 290*c* is less than about 1000 W. The third etching process 290*c* is also performed at a bias power that is lower than the bias power of the first etching process 290*a*. That is, the etch rate of the third etching process 290*c* is less than the etch rate of the first etching process 290*a*. In an embodiment, the bias power of the third etching process 290*c* is less than about 200 W. By performing the third etching process 290*c* under the conditions stated above, the etch result of the third etching process 290*c* may be well controlled. More specifically, slowly etching the first etch stop layer 285 would substantially prevent the damage to the top surface 284*s* of the contact pad 284A/284B. In an embodiment, after the performing of the third etching process 290*c*, the portion of the top surface of the contact pad 284A/284B exposed by the opening 292*c* is substantially coplanar with a remaining of the top surface 284*s* of the contact pad 284A/284B covered by the second passivation structure 290. In some embodiments, the performing of the third etching process 290*c* may also slightly reduce a height of the patterned passivation layer 289.

Figure 17:
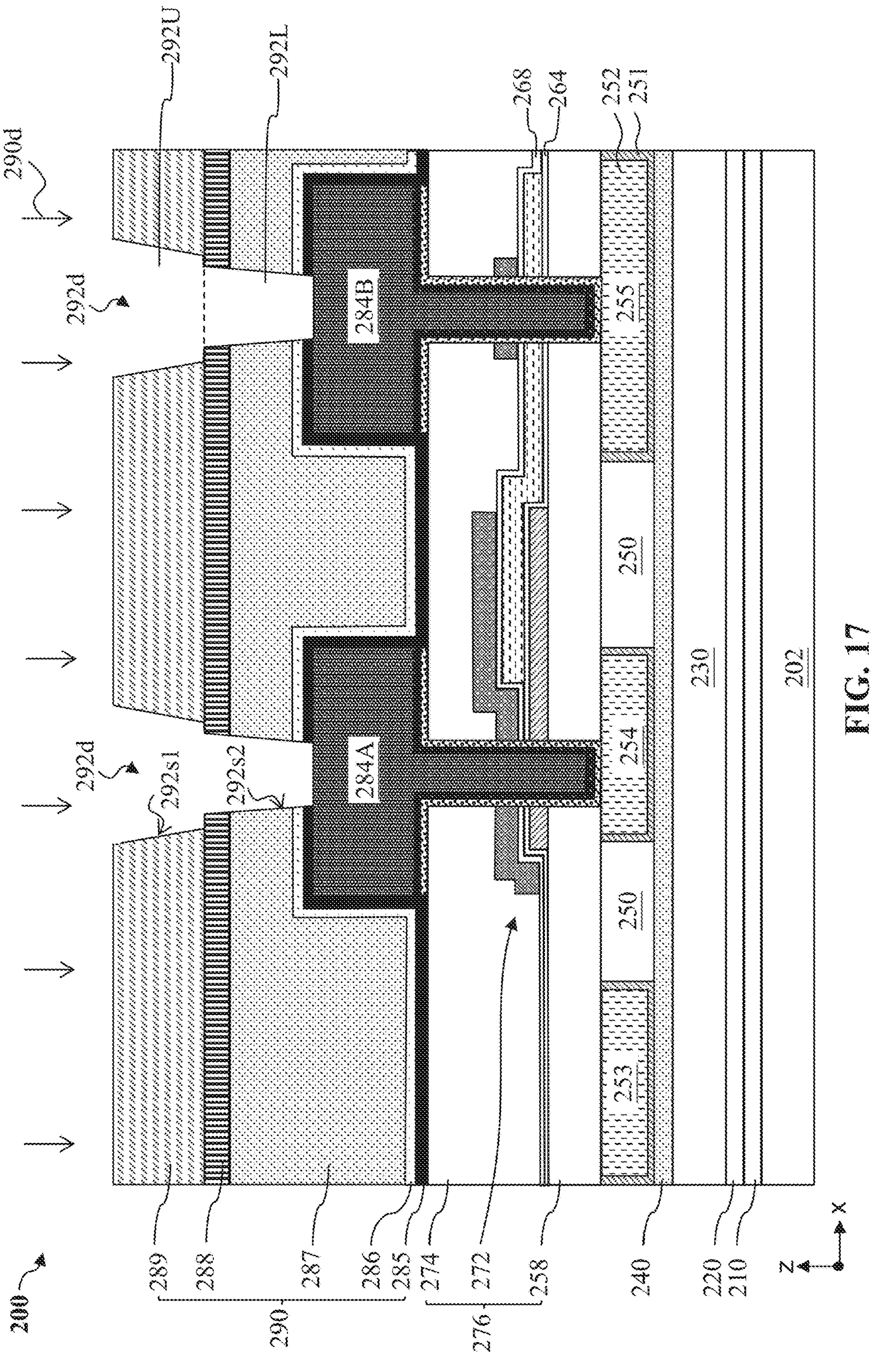

Referring to FIGS. 1 and 17, method 100 includes a block 124 where a fourth etching process 290*d* is performed to selectively etch the patterned passivation layer 289 to laterally expand an upper portion 292U of the opening 292*c*. The fourth etching process 290*d* is performed to selectively etch the patterned passivation layer 289 without substantially etching its surrounding features (e.g., the second etch stop layer 288, the oxide layer 287, the oxide liner 286, the first etch stop layer 285, the contact pad 284A/284B). The performing of the fourth etching process 290*d* laterally expands the upper portion 292U of the opening 292*c*. For ease of description, the laterally expanded opening 292*c* after the performing of the fourth etching process 290*d* is referred to as a pad access opening 292*d*. In the cross-sectional view, sidewall surface of the pad access opening 292*d* is non-linear. Specifically, sidewall surface 292*s*1 of the upper portion 292U of the pad access opening 292*d* and sidewall surface 292*s*2 of the lower portion 292L of the pad access opening 292*d* are not portions of a continuous linear line. As depicted in FIG. 17, after the performing of the fourth etching process 290*d*, the pad access opening 292*d* exposes a portion of a top surface of the second etch stop layer 288. Forming the pad access opening 292*d* with an expanded upper portion facilitate the formation of the bonding structure that would be formed therein with an increased volume and thus a reduced parasitic resistance.

In an embodiment, the fourth etching process 290*d* includes a plasma dry etch that exposes the semiconductor structure 200 to an etch gas. In an embodiment, the etch gas includes a combination of oxygen ($O_2$) and argon (Ar). In an embodiment, the fourth etching process 290*d* is performed at a RF source power that is greater than the RF source power of the third etching process 290*c*. That is, a plasma density of the fourth etching process 290*d* is greater than a plasma density of the third etching process 290*c*. In an embodiment, the RF source power of the fourth etching process 290*d* is greater than about 1000 W. The fourth etching process 290*d* is also performed at a bias power that is lower than the bias power of the third etching process 290*c*. In an embodiment, the bias power of the fourth etching process 290*d* is less than 50 W. In an embodiment, the bias power of the fourth etching process 290*d* is substantially equal to 0. By providing a bias power that is even lower than the third etching process 290*c*, the fourth etching process 290*d* may become an isotropic etching that can laterally and selectively etch the patterned passivation layer 289 to laterally expand an upper portion 292U of the opening 292*c*, thereby forming the pad access opening 292*d*. The performing of the fourth etching process 290*d* further reduces a height of the patterned passivation layer 289. In some embodiments, the first etching process 290*a*, the second etching process 290*b*, the third etching process 290*c*, and the fourth etching process 290*d* may also be referred to as a series steps of one etching process.

Figure 18:
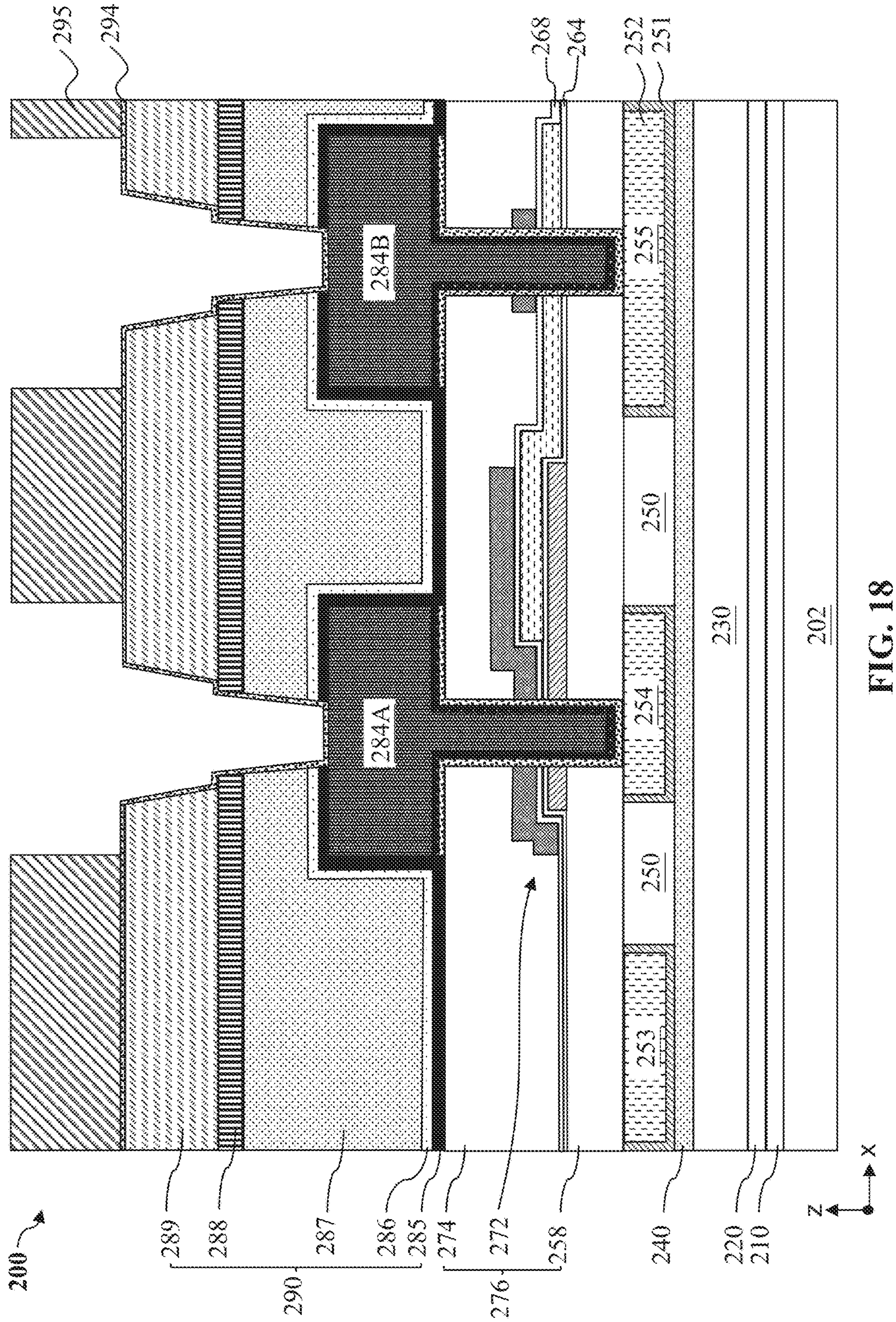
Figure 19:
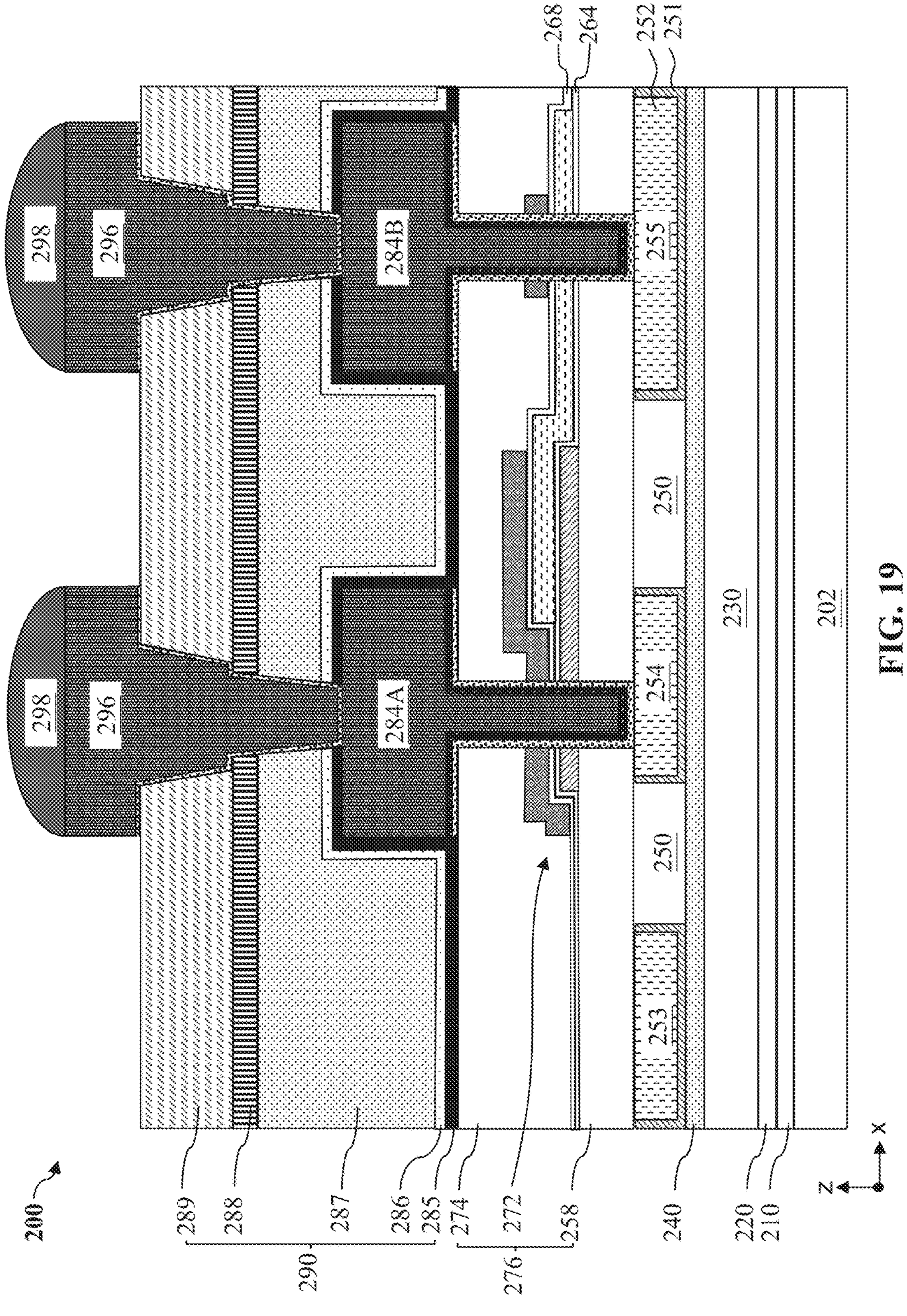
Figure 20:
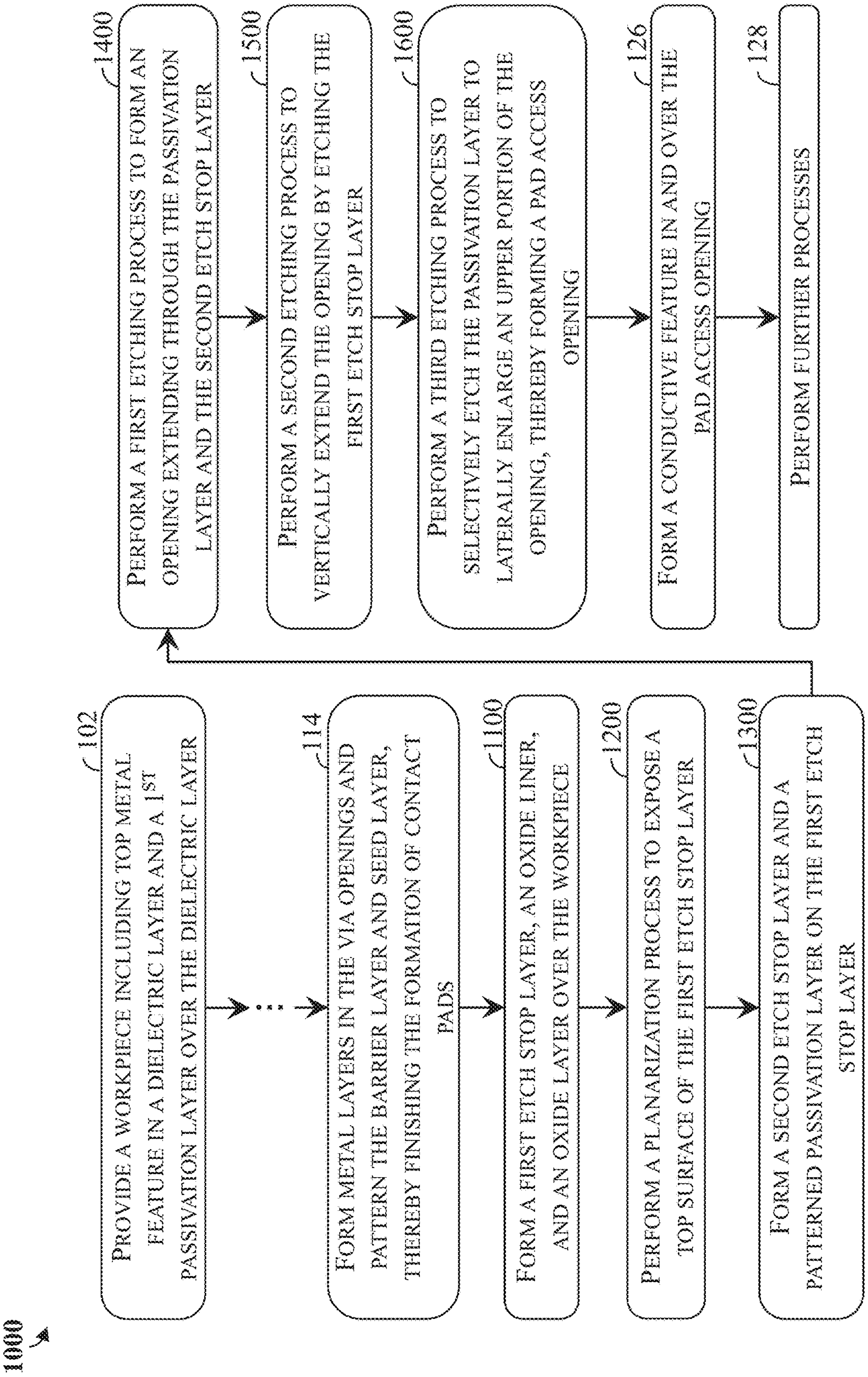
FIG. 20 is a flow chart of an alternative method for fabricating an alternative semiconductor structure, according to various aspects of the present disclosure.

Referring to FIGS. 1 and 18-19, method 100 includes a block 126 where a conductive feature (e.g., bonding structure) is formed in and over the pad access opening 292*d*. With reference to FIG. 18, an under-bump metallization (UBM) layer 294 is conformally formed over the semiconductor structure 200, including in the pad access opening 292*d* by performing any suitable deposition processes (e.g., ALD, CVD, PVD). In an embodiment, the UBM layer 294 includes a diffusion barrier layer (not separately labeled), which may be formed of titanium, tantalum, titanium nitride, tantalum nitride, or the like. The diffusion barrier layer prevents or reduces electromigration of copper or oxygen diffusion into copper. The UBM layer 294 may also include a seed layer (not separately labeled) formed on the diffusion barrier layer. In an embodiment, a portion of the UBM layer 294 is in direct contact with a portion of the top surface of the second etch stop layer 288 exposed by the pad access opening 292*d*. After forming the UBM layer 294, a protective layer 295 is formed over the semiconductor structure 200 and patterned to form openings exposing portions of the UBM layer 294 formed in and adjacent to the pad access openings 292. In an embodiment, the protective layer 295 includes a photoresist layer. The photoresist layer may be blanketly deposited over the semiconductor structure 200, including in the pad access openings 292*d*, using spin-on coating. Photolithography techniques (e.g., exposure, developing) are then used to pattern the protective layer 295 to expose portions of the UBM layer 294 formed in and adjacent to the pad access openings 292 while covering other portions of the UBM layer 294.

While using the patterned protective layer 295 as a mask, as depicted in FIG. 19, a conductive material 296 is formed in and over the pad access openings 292 and over the UBM layer 294 by sputtering, printing, electroplating, electroless plating, and/or chemical vapor deposition (CVD) methods. The conductive material 296 includes, for example, pure elemental copper, copper containing unavoidable impurities, or copper alloys containing minor amounts of elements such as tantalum, indium, tin, zinc, manganese, chromium, titanium, germanium, strontium, platinum, magnesium, aluminum or zirconium. The conductive material 296 may be referred to as a metal pillar 296. A lower portion of metal pillar 296 that is formed in the pad access opening 292*d* tracks the shape of pad access openings 292*d*. A solder feature 298 is then formed over the metal pillar 296. The solder feature 298 may be formed by a plating process. In some implementations, the solder feature 298 may include nickel (Ni), tin (Sn), tin-lead (SnPb), gold (Au), silver (Ag), palladium (Pd), indium (In), nickel-palladium-gold (NiPdAu), nickel-gold (NiAu), SnAg, SnPb, SnAgCu, or other suitable metal alloy. After forming the solder feature 298, the patterned protective layer 295 may be selectively removed, and portions of the UBM layer 294 not covered by the metal pillar 296 and the solder feature 298 may be selectively removed. In an embodiment, a reflow process can be performed on the solder feature 298, thus the solder feature 298 becomes a reflowed solder feature with a spherical top surface as shown in FIG. 19. The solder feature 298, the metal pillar 296, and the UBM layer 294 thereunder form a bump structure or a bonding structure.

Referring to FIG. 1, method 100 includes a block 128 where further processes are performed. For example, after forming the bump structure, the semiconductor structure 200 may be attached to a substrate, such as a dielectric substrate, a package substrate, a printed circuit board (PCB), an interposer, a wafer, another chip, a package unit, or the like. For example, embodiments may be used in chip-to-substrate bonding configuration, a chip-to-chip bonding configuration, a chip-to-wafer bonding configuration, a wafer-to-wafer bonding configuration, chip-level packaging, wafer-level packaging, or the like. In an embodiment, the bump structure may be connected to a metal trace formed in a semiconductor package.

FIG. 20 is a flow chart of an alternative method 1000 for fabricating an alternative semiconductor structure 2000, according to various aspects of the present disclosure. The method 1000 is similar to the method 100, and one of the differences includes the formation of the second passivation structure 290. The method 1000 includes blocks 102, 104, 106, 108, 110, 112, and 114 of method 100 of FIG. 1, and repeated description is omitted for reason of simplicity. For case of description, the semiconductor structure 200 represented by FIG. 12 is referred to as a semiconductor structure 2000 in this alternative embodiment. With reference to FIGS. 20 and 12, after performing operations in blocks 102, 104, 106, 108, 110, 112, and 114, method 1000 proceeds to perform operations in block 1100 where the first etch stop layer 285, the oxide liner 286, and the oxide layer 287 are formed over the semiconductor structure 2000. The formation of the first etch stop layer 285, the oxide liner 286, and the oxide layer 287 have been described above and repeated description is omitted.

Figure 21:
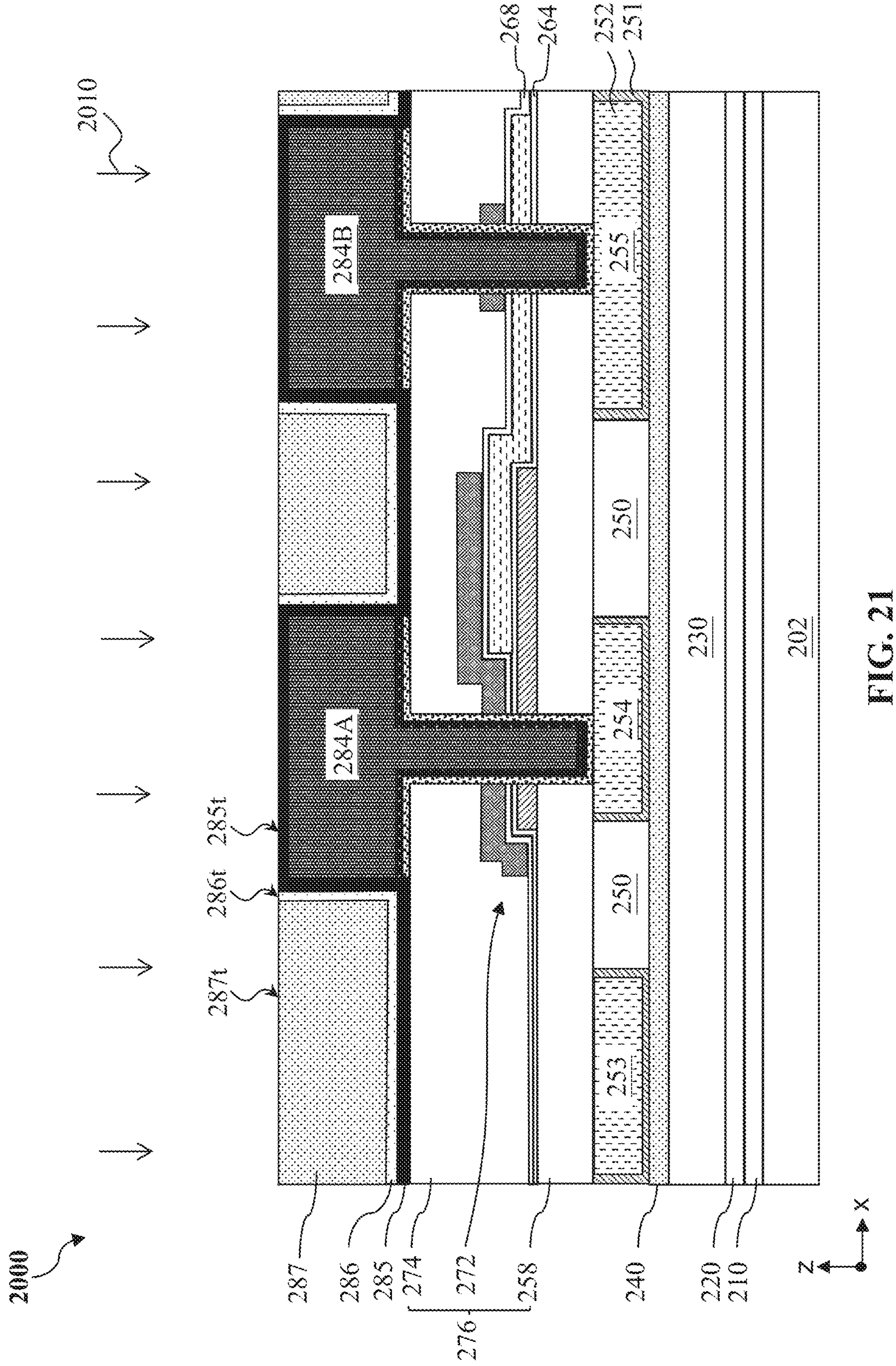
FIGS. 21, 22, 23, 24, 25, and 26 are fragmentary cross-sectional views of an alternative semiconductor structure during various fabrication stages in the method of FIG. 20, according to various aspects of the present disclosure.

Referring to FIGS. 20 and 21, method 1000 also includes a block 1200 where a planarization process 2010 is performed to the semiconductor structure 2000. More specifically, the planarization process 2010 removes portions of the oxide liner 286 and the oxide layer 287 until portions of the first etch stop layer 285 formed directly on the contact pads 284A and 284B are exposed. As represented by FIG. 21, after the performing of the planarization process 2010, the topmost surface 286*t* of the planarized oxide liner 286 is coplanar with the topmost surface 285*t* of the first etch stop layer 285 and the top surface of the planarized oxide layer 287.

Figure 22:
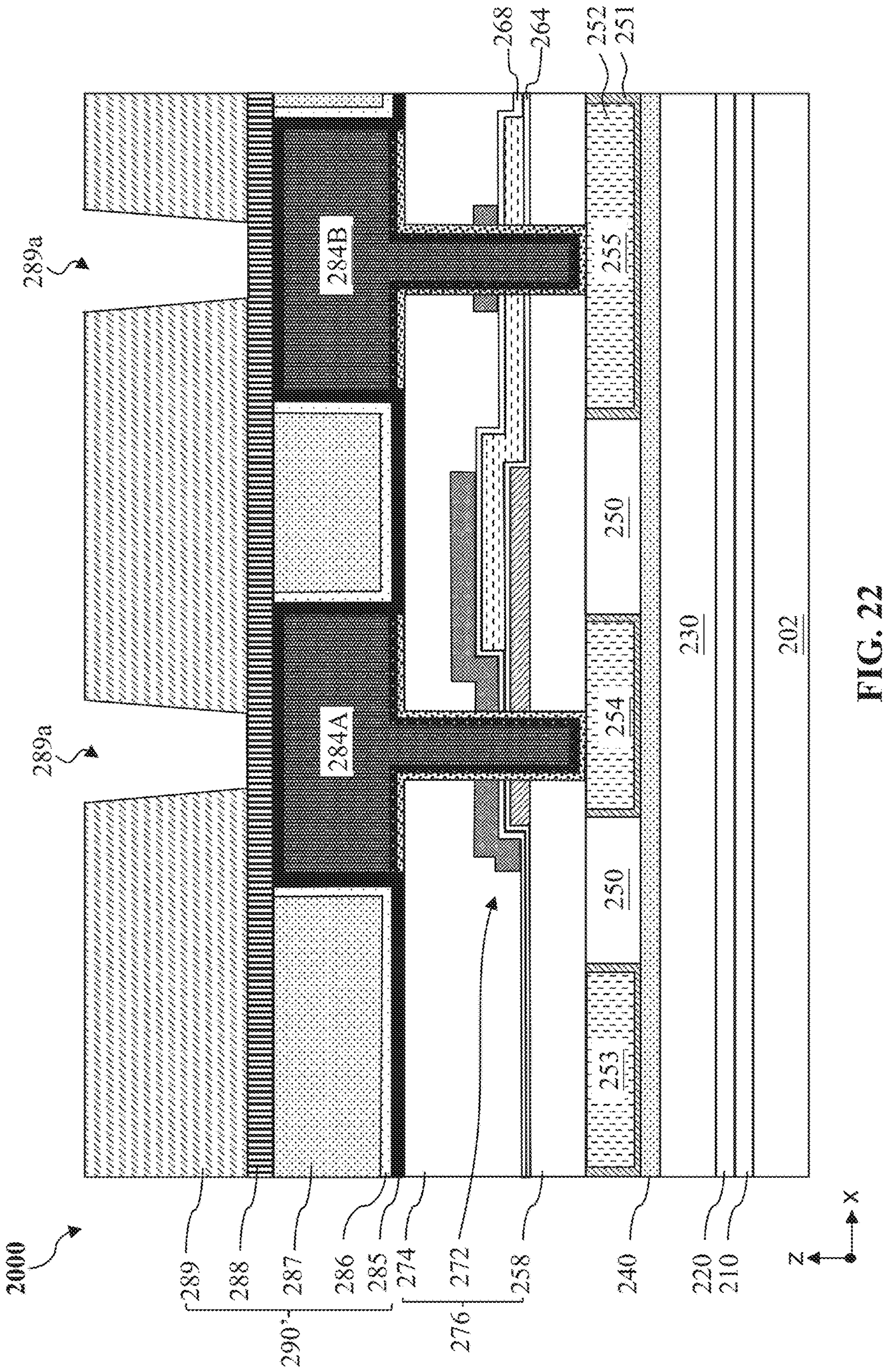

Referring to FIGS. 20 and 22, method 1000 includes a block 1300 where the second etch stop layer 288 and the passivation layer 289 are formed over the semiconductor structure 2000, thereby completing the formation of a second passivation structure 290'. The formations and compositions of second etch stop layer 288 and the passivation layer 289 are described above with reference to FIG. 13, and repeated description is omitted for reason of simplicity. In this depicted example, the second etch stop layer 288 is in direct contact with the planarized oxide liner 286, the first etch stop layer 285 and the planarized oxide layer 287. In the present embodiments, after forming the second passivation structure 290', the passivation layer 289 is then patterned using photolithography. The patterned passivation layer 289 may also serve as an etch mask during subsequent etching processes. In this illustrated example, the patterned passivation layer 289 has two openings 289*a* exposing portions of the second etch stop layer 288.

Figure 23:
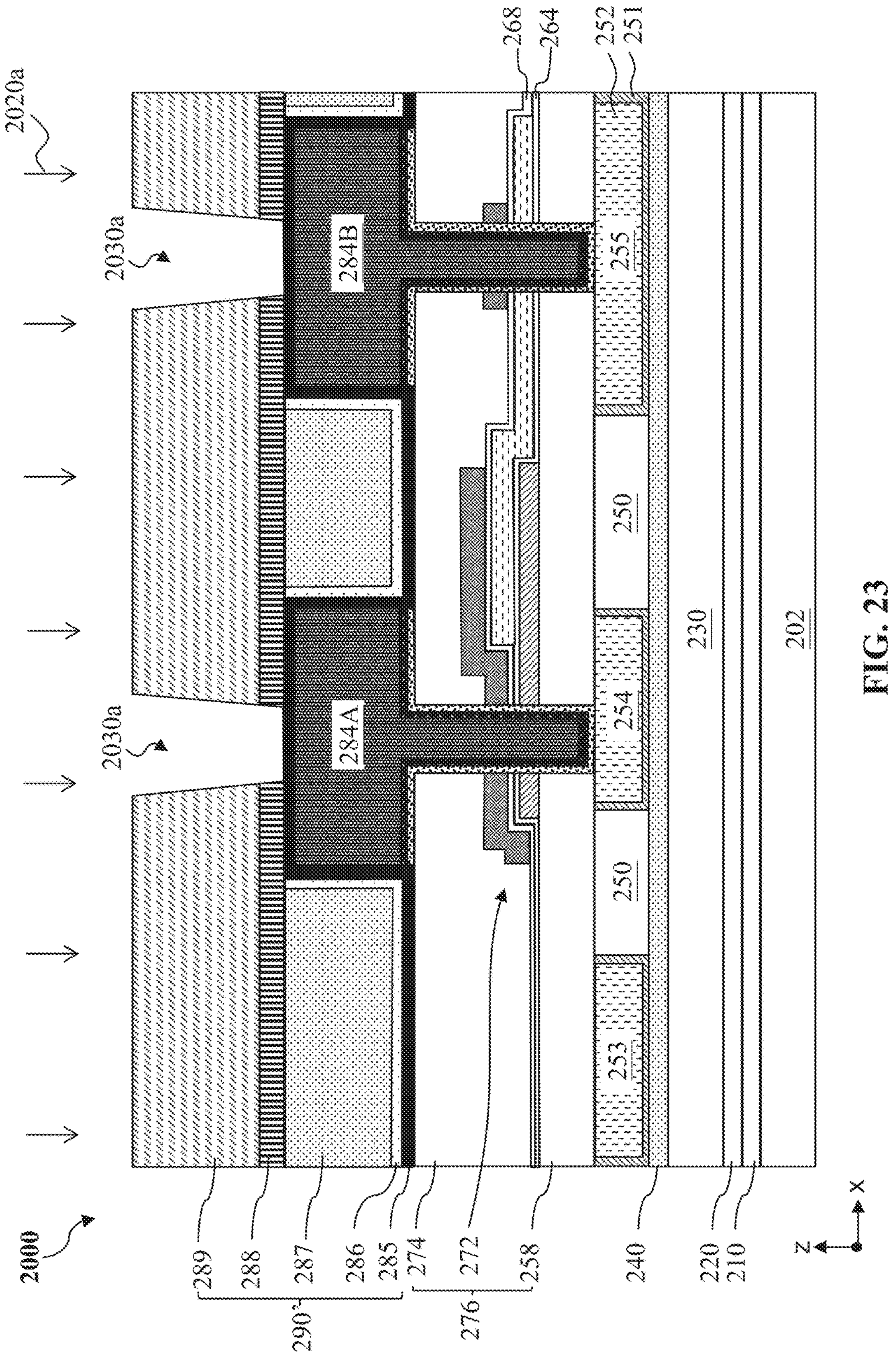

Referring to FIGS. 20 and 23, method 1000 includes a block 1400 where a first etching process 2020*a* is performed to vertically extend the opening 289*a*. For case of description, the vertically extended opening 289*a* after the performing of the first etching process 2020*a* is referred to as the opening 2030*a*. While using the patterned passivation layer 289 as an etch mask, the first etching process 2020*a* is performed to transfer a pattern defined by the patterned passivation layer 289 to the second etch stop layer 288 by removing portion(s) of the second etch stop layer 288 not covered by the patterned passivation layer 289 to form the opening(s) 2030*a*. The first etching process 2020*a* is substantially similar to the first etching process 290*a* described above with reference to FIG. 14, and repeated description is omitted for reason of simplicity. The first etching process 2020*a* stops once the top surface of the first etch stop layer 285 is partially exposed. In some embodiments, the performing of the first etching process 2020*a* may also slightly reduce a height of the patterned passivation layer 289.

Figure 24:
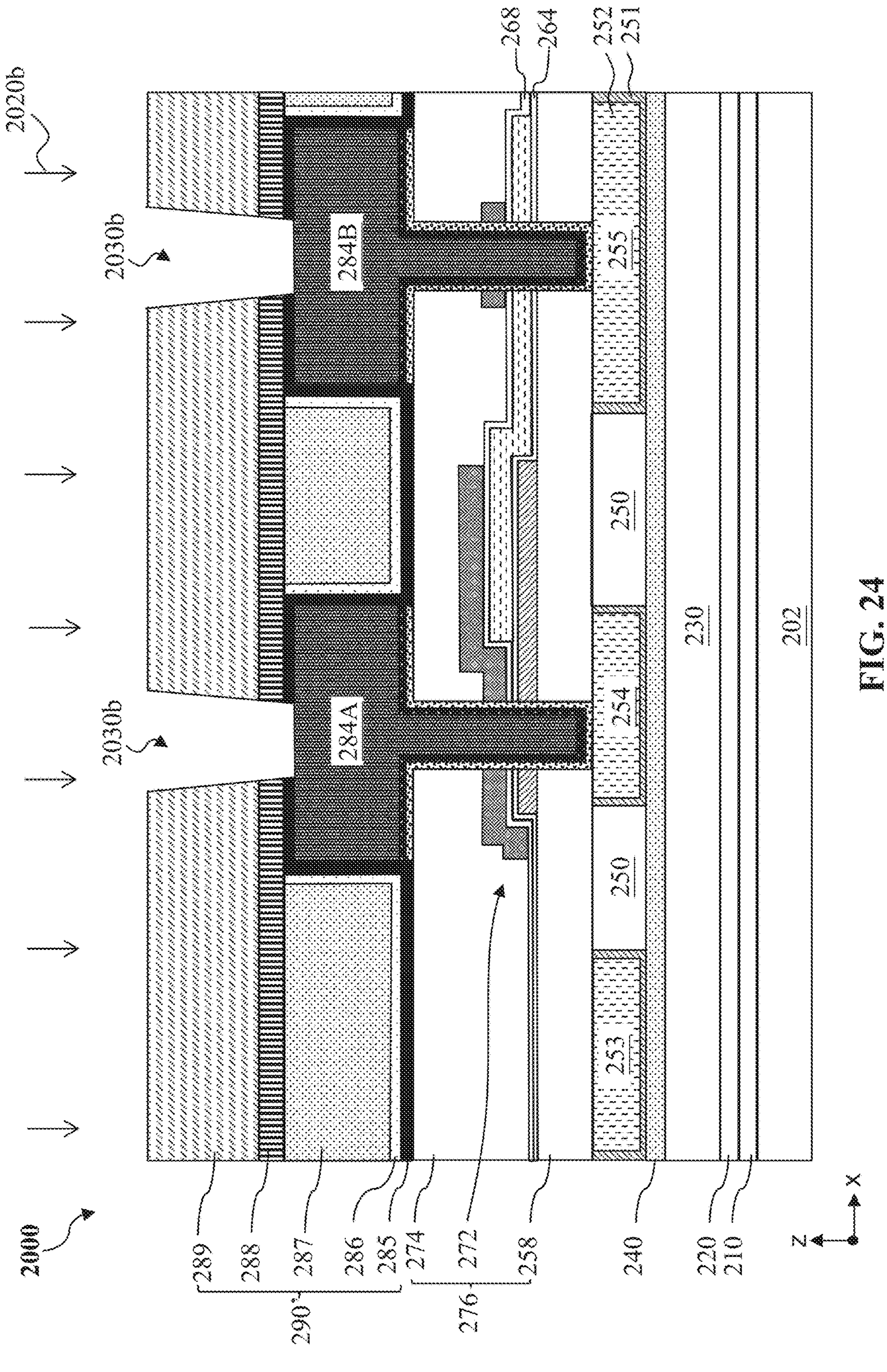

Referring to FIGS. 20 and 24, method 1000 includes a block 1500 where a second etching process 2020*b* is performed to vertically extend the opening 2030*a* by etching the first etch stop layer 285. While using the patterned passivation layer 289 as an etch mask, the second etching process 2020*b* is performed to etch the first etch stop layer

285 to vertically extend the opening 2030*a*. For case of description, the vertically extended opening 2030*a* after the performing of the second etching process 2020*b* is referred to as the opening 2030*b*. As depicted by FIG. 24, the opening 2030*b* exposes a portion of the top surface 284*s* of the contact pad (e.g., the contact pad 284A or the contact pad 284B). The second etching process 2020*b* is substantially similar to the third etching process 290*c* described above with reference to FIG. 16, and repeated description is omitted for reason of simplicity. In some embodiments, the performing of the second etching process 2020*b* may also slightly reduce a height of the patterned passivation layer 289.

Figure 25:
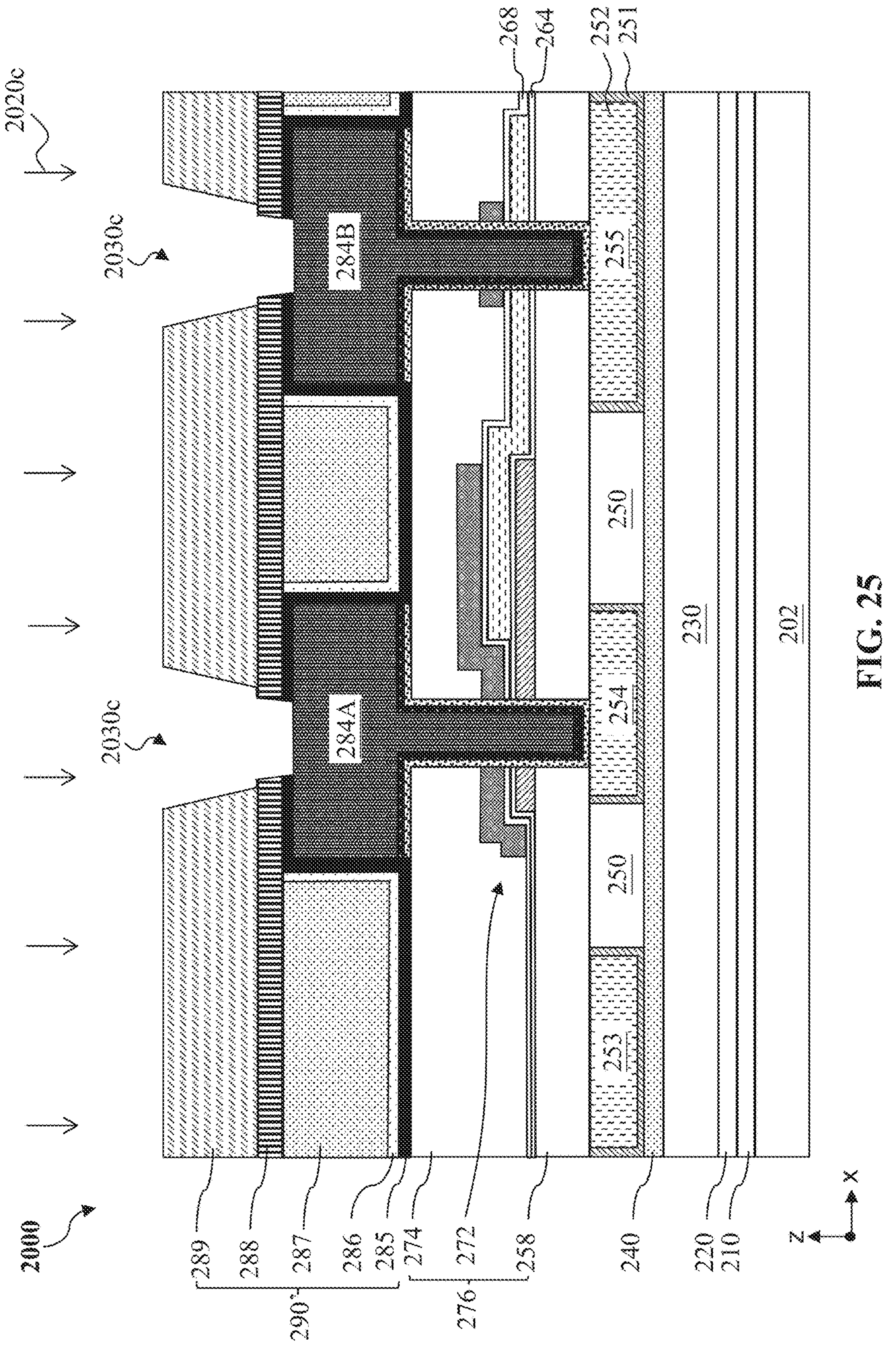
Figure 26:
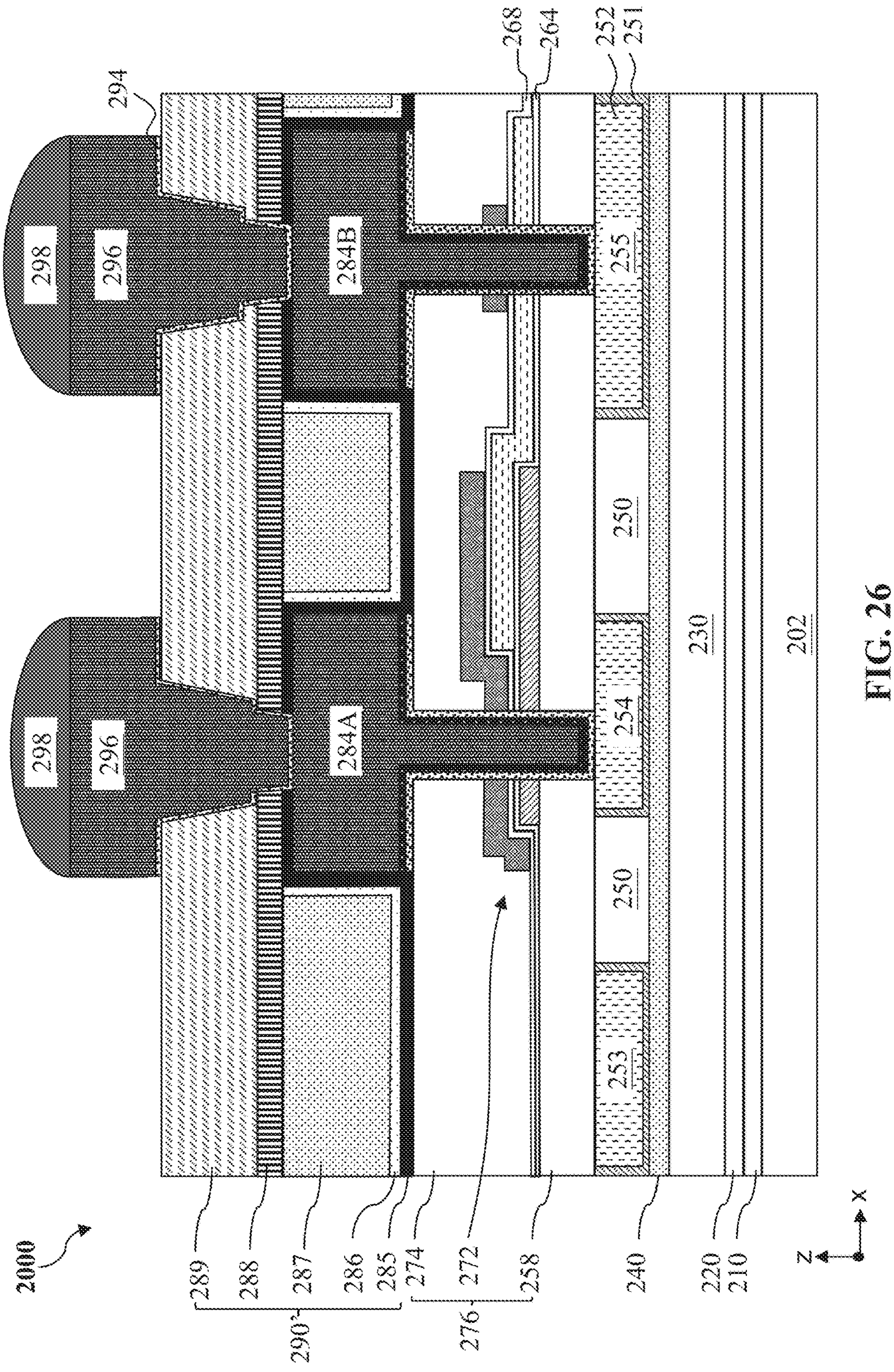

Referring to FIGS. 20 and 25, method 1000 includes a block 1600 where a third etching process 2020*c* is performed to selectively etch the patterned passivation layer 289 to laterally expand an upper portion of the opening 2030*b*. The third etching process 2020*c* is performed to selectively etch the patterned passivation layer 289 without substantially etching its surrounding features (e.g., the second etch stop layer 288, the first etch stop layer 285, the contact pad 284A/284B). The performing of the third etching process 2020*c* laterally expands the upper portion of the opening 2030*b*. The performing of the third etching process 2020*c* further reduces a height of the patterned passivation layer 289. For case of description, the laterally expanded opening 2030*b* after the performing of the third etching process 2020*c* is referred to as a pad access opening 2030*c*. As depicted in FIG. 25, after the performing of the third etching process 2020*c*, the pad access opening 2030*c* exposes a portion of a top surface of the second etch stop layer 288. The third etching process 2020*c* is substantially similar to the fourth etching process 290*d* described above with reference to FIG. 17, and repeated description is omitted for reason of simplicity. After forming the pad access openings 2030*c*, the performing of the method 1000 proceeds to performing operations in block 126 and 128 to finish the fabrication of the semiconductor structure.

Figure 27:
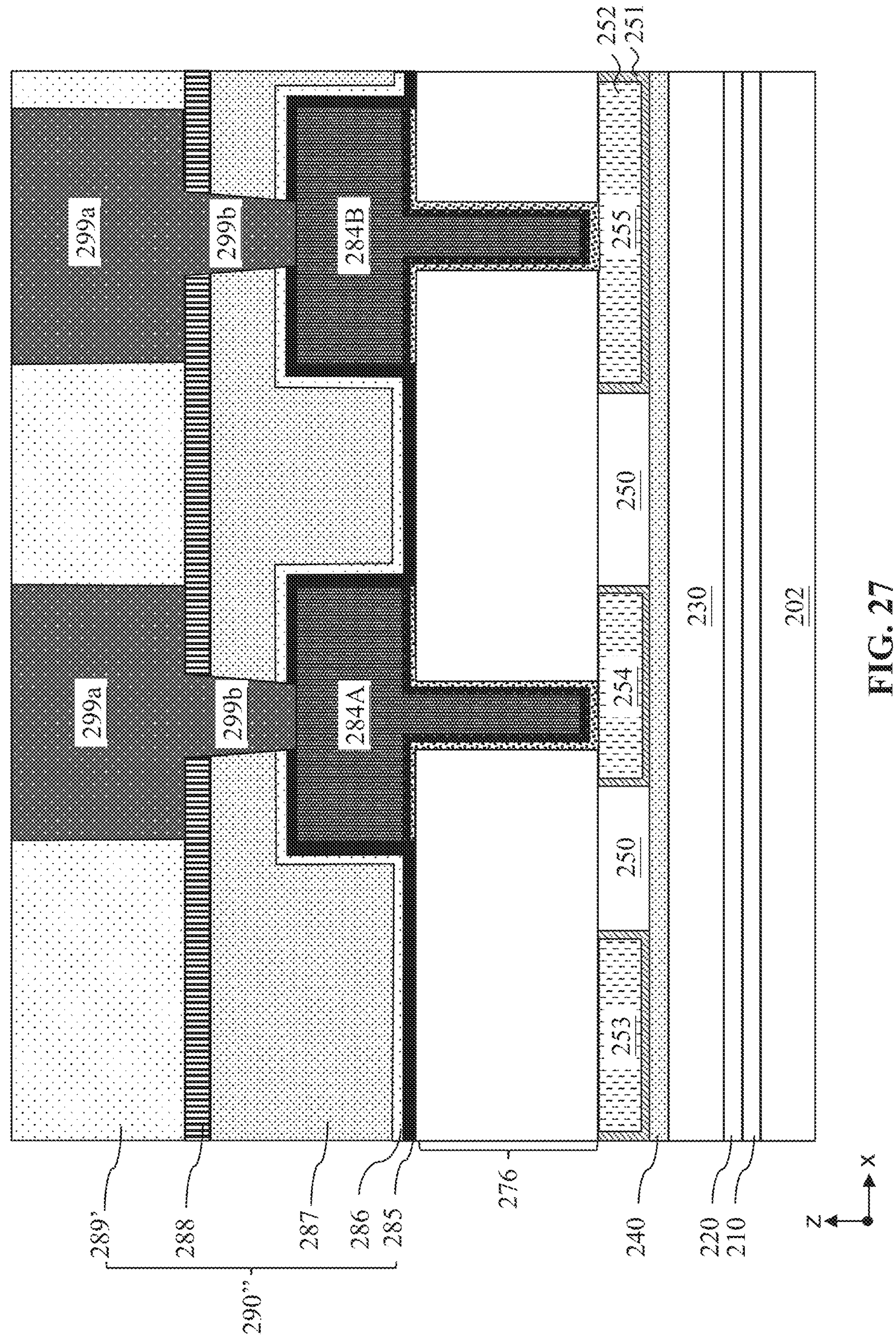
FIG. 27 depicts a fragmentary cross-sectional view of another alternative semiconductor structure, according to various aspects of the present disclosure.

System-on-integrate-chip (SoIC) has been developed to include a number of device dies such as processors and memory cubes in the same package. The SoIC can include device dies formed using different technologies and have different functions bonded to the same device die, thus forming a system. This may save manufacturing cost and optimize device performance. contact pads and bonding structures (e.g., bonding pad vias (BPVs) and bonding pad metal lines (BPMs)) are formed in device dies such that the SoIC may be able to fulfill satisfactory electrical functions. The method 100 and the method 1000 may also be applied to protect contact pads and reduce parasitic resistance of the SoIC. FIG. 27 depict a fragmentary cross-sectional view of a device die of the SoIC after performing operations of method 100. In this present embodiments, the device die includes a second passivation structure 290" that is similar to the second passivation structure 290, and one of the differences between these two passivation structures includes that the passivation layer 289' of the second passivation structure 290" may be an oxide layer, and a photoresist layer may be formed over the passivation layer 289' to facilitate the patterning of the passivation layer 289', while the passivation layer 289 may be patterned without forming a photoresist layer thereon. Operations of blocks 118-124 may be then performed to form a pad access opening. After forming pad access opening, in this alternative embodiment, a bonding structure is formed in the pad access opening. An upper portion of the bonding structure that is formed on and over the second etch stop layer 288 may be referred to as a bonding pad metal line (BPM) 299*a*, and a lower portion of the bonding structure that is disposed between the bonding pad metal line (BPM) 299*a* and the contact pad 284A/284B may be referred to as a bonding pad vias (BPV) 299*b*.

Although not intended to be limiting, one or more embodiments of the present disclosure provide many benefits to a semiconductor structure and the formation thereof. For example, the present disclosure provides a low resistance contact pad having a planar top surface and methods of forming the low resistance contact pad and the bonding structure landed thereon. In the present embodiments, by forming the contact pad having a planar top surface and by configuring passivation structure and etching steps, the bonding structure may be landed on any site of the planar top surface of the contact pad without substantially damaging the planar top surface of the contact pad.

The present disclosure provides for many different embodiments. Semiconductor structures and methods of fabrication thereof are disclosed herein. In one exemplary aspect, the present disclosure is directed to a method. The method includes receiving a structure that includes a metal feature, a first passivation structure over the metal feature, and a first opening extending through the first passivation structure and exposing the metal feature. The method also includes forming a conductive layer in the first opening, forming a second passivation structure over the conductive layer, performing a first etching process to form a second opening extending through the second passivation structure and exposing the conductive layer, performing a second etching process to selectively etch an upper portion of the second passivation structure to enlarge an upper portion of the second opening, and after the performing of the second etching process, forming a conductive feature in the second opening.

In some embodiments, the method may also include depositing a seed layer over the structure and in the first opening, after the depositing of the seed layer, forming a mask layer over the structure, patterning the mask layer to form a mask opening exposing a portion of the seed layer in the first opening, and after the forming of the conductive layer in the first opening, selectively removing the patterned mask layer. In some embodiments, the forming of the conductive layer in the first opening may include depositing a metal layer formed essentially of copper by performing an electro-chemical plating process, and upon completion of the electro-chemical plating process, the metal layer may include a planar top surface. In some embodiments, the forming of the second passivation structure may include conformally depositing a first etch stop layer over the structure, conformally depositing a first oxide layer over the first etch stop layer, forming a second oxide layer over the first oxide layer, performing a planarization process to the second oxide layer to provide a planar top surface, forming a second etch stop layer on the second oxide layer, and forming a passivation layer over the second etch stop layer. In some embodiments, the performing of the planarization process may also remove a portion of the first oxide layer disposed directly over the conductive layer, and after the planarization process, a top surface of the planarized second oxide layer may be coplanar with a topmost surface of the first etch stop layer. In some embodiments, after the planarization process, a top surface of the planarized second oxide layer may be above a topmost surface of the first etch stop layer. In some embodiments, the method may also include, before the performing of the first etching process, patterning the passivation layer, and the performing of the first etching process may include performing a first step to etch the second etch stop layer, performing a second step to etch the second oxide layer and the first oxide layer, and performing a third step to etch the first etch stop layer without etching the conductive layer. In some embodiments, a bias power of the third step may be less than a bias power of the first step. In some embodiments, the first passivation structure may include a metal-insulator-metal (MIM) capacitor embedded in a dielectric structure, and the first opening may extend through at least one conductor plate of the MIM capacitor.

In another exemplary aspect, the present disclosure is directed to a method. The method includes forming a first passivation structure over a substrate, forming a via opening extending through the first passivation structure, performing an electro-chemical plating (ECP) process to form a copper layer over the substrate and in the via opening, wherein, upon completion of the electro-chemical plating process, an entity of a top surface of the copper layer is substantially planar, conformally depositing an etch stop layer extending along sidewall and top surfaces of the copper layer, forming a second passivation structure on the etch stop layer, performing a first etching process to form an opening extending through the second passivation structure and exposing the etch stop layer, performing a second etching process to vertically extending the opening by etching through the etch stop layer without etching the copper layer, and forming a conductive feature in the vertically extended opening, wherein an entity of a bottom surface of the conducive feature is substantially planar and is coplanar with an entity of the top surface of the copper layer.

In some embodiments, the method may also include, after the forming of the via opening, conformally depositing a barrier layer over the substrate, conformally depositing a seed layer on the barrier layer, forming a patterned mask layer over the substrate to expose a portion of the seed layer formed in the via opening, and patterning the barrier layer and seed layer after forming the copper layer in the via opening. In some embodiments, the method may also include, after the performing of the second etching process, performing a third etching process to enlarge an upper portion of the via opening. In some embodiments, the forming of the second passivation structure may include conformally depositing a first oxide layer over the etch stop layer, conformally depositing a second oxide layer over the first oxide layer, performing a planarization process to the second oxide layer to provide a planar top surface, forming a nitride layer on the planarized second oxide layer, and forming a dielectric layer on the nitride layer. In some embodiments, the top surface of the planarized second oxide layer may be coplanar with a top surface of the etch stop layer. In some embodiments, the top surface of the planarized second oxide layer may be above a top surface of the etch stop layer. In some embodiments, the method may also include before the performing of the first etching process, patterning the dielectric layer, and the performing of the first etching process may include performing a first step to etch though the nitride layer, and performing a second step to etch though the planarized second oxide layer and the first oxide layer.

In yet another exemplary aspect, the present disclosure is directed to a semiconductor structure. The semiconductor structure includes a lower conductive feature over a substrate, a connector conductive feature over and in direct contact with the lower conductive feature, a first passivation structure over the connector conductive feature, an upper conductive feature extending through the first passivation structure and in direct contact with the connector conductive feature. The first passivation structure includes a first etch stop layer extending along sidewall and top surfaces of the connector conductive layer, a first oxide layer conformally disposed on the first etch stop layer, a second oxide layer disposed on the first oxide layer, wherein an entirety of a top surface of the second oxide layer is substantially planar, a passivation layer disposed over the second oxide layer, and a bottommost surface of the upper conductive feature is coplanar with an entirety of a top surface of the connector conductive feature.

In some embodiments, the first passivation structure may further include a second etch stop layer disposed between the second oxide layer and the passivation layer, and a thickness of the second etch stop layer may be greater than a thickness of the first etch stop layer. In some embodiments, the upper conductive feature may include a top portion over the first passivation structure and a bottom portion extending through the first passivation structure, and the bottom portion of the upper conductive feature is in direct contact with a portion of a top surface of the second etch stop layer. In some embodiments, the semiconductor structure may also include a second passivation structure disposed on the lower conductive feature, and the connector conductive feature may include a copper layer having a top portion over the second passivation structure and a bottom portion extending through the second passivation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a structure comprising:

a metal feature, a first passivation structure over the metal feature, and a first opening extending through the first passivation structure and exposing the metal feature;

forming a conductive layer in the first opening;

forming a second passivation structure over the conductive layer;

performing a first etching process to form a second opening extending through the second passivation structure and exposing the conductive layer;

performing a second etching process to selectively etch an upper portion of the second passivation structure to enlarge an upper portion of the second opening; and after the performing of the second etching process, forming a conductive feature in the second opening.

2. The method of claim 1, further comprising:

depositing a seed layer over the structure and in the first opening;

after the depositing of the seed layer, forming a mask layer over the structure;

patterning the mask layer to form a mask opening exposing a portion of the seed layer in the first opening; and after the forming of the conductive layer in the first opening, selectively removing the patterned mask layer.

3. The method of claim 1, wherein the forming of the conductive layer in the first opening comprises depositing a metal layer formed essentially of copper by performing an electro-chemical plating process, and wherein upon completion of the electro-chemical plating process, the metal layer comprises a planar top surface.

4. The method of claim 1, wherein the forming of the second passivation structure comprises:

conformally depositing a first etch stop layer over the structure;

conformally depositing a first oxide layer over the first etch stop layer;

forming a second oxide layer over the first oxide layer;

performing a planarization process to the second oxide layer to provide a planar top surface;

forming a second etch stop layer on the second oxide layer; and forming a passivation layer over the second etch stop layer.

5. The method of claim 4, wherein, after the planarization process, a top surface of the planarized second oxide layer is above a topmost surface of the first etch stop layer.

6. The method of claim 5, further comprising:

before the performing of the first etching process, patterning the passivation layer, wherein the performing of the first etching process comprises:

performing a first step to etch the second etch stop layer;

performing a second step to etch the second oxide layer and the first oxide layer; and performing a third step to etch the first etch stop layer without etching the conductive layer.

7. The method of claim 6, wherein a bias power of the third step is less than a bias power of the first step.

8. The method of claim 4, wherein the conductive feature extends on a portion of a top surface of the second etch stop layer.

9. The method of claim 1, wherein the first passivation structure comprises a metal-insulator-metal (MIM) capacitor embedded in a dielectric structure, wherein the first opening extends through at least one conductor plate of the MIM capacitor.

10. A method, comprising:

forming a first passivation structure over a substrate;

forming a via opening extending through the first passivation structure;

performing an electro-chemical plating (ECP) process to form a copper layer over the substrate and in the via opening, wherein, upon completion of the electro-chemical plating process, an entity of a top surface of the copper layer is substantially planar;

conformally depositing an etch stop layer extending along sidewall and top surfaces of the copper layer;

forming a second passivation structure on the etch stop layer;

performing a first etching process to form an opening extending through the second passivation structure and exposing the etch stop layer;

performing a second etching process to vertically extending the opening by etching through the etch stop layer without etching the copper layer; and forming a conductive feature in the vertically extended opening, wherein an entity of a bottom surface of the conducive feature is substantially planar and is coplanar with an entity of the top surface of the copper layer.

11. The method of claim 10, further comprising:

after the forming of the via opening, conformally depositing a barrier layer over the substrate;

conformally depositing a seed layer on the barrier layer;

forming a patterned mask layer over the substrate to expose a portion of the seed layer formed in the via opening; and patterning the barrier layer and seed layer after forming the copper layer in the via opening.

12. The method of claim 11, further comprising:

after the performing of the second etching process, performing a third etching process to enlarge an upper portion of the via opening.

13. The method of claim 11, wherein the forming of the second passivation structure comprises:

conformally depositing a first oxide layer over the etch stop layer;

conformally depositing a second oxide layer over the first oxide layer;

performing a planarization process to the second oxide layer to provide a planar top surface;

forming a nitride layer on the planarized second oxide layer; and forming a dielectric layer on the nitride layer.

14. The method of claim 13, wherein, the top surface of the planarized second oxide layer is above a top surface of the etch stop layer.

15. The method of claim 14, further comprising:

before the performing of the first etching process, patterning the dielectric layer, wherein the performing of the first etching process comprises:

performing a first step to etch though the nitride layer; and performing a second step to etch though the planarized second oxide layer and the first oxide layer.

16. The method of claim 13, wherein the conductive feature comprises a top portion over the dielectric layer, a middle portion under the top portion and over the nitride layer, and a bottom portion extending through the nitride layer, wherein a sidewall surface of the middle portion of the conductive feature is spaced apart from a sidewall surface of the bottom portion of the conductive feature.

17. A method, comprising:

forming a conductive pad over a substrate;

conformally depositing an etch stop layer on the conducive pad;

conformally forming an oxide liner on the etch stop layer;

forming a dielectric layer over the oxide liner and the conductive pad, the dielectric layer comprising a planar top surface;

forming a passivation structure over the dielectric layer;

performing an etching process to form an opening exposing a top surface of the conductive pad, wherein the performing of the etching process comprises:

performing a first etch step to etch through the passivation structure, thereby forming a trench exposing a top surface of the dielectric layer, performing a second etch step to etch through the dielectric layer and the oxide liner, thereby extending the trench to expose a top surface of the etch stop layer, performing a third etch step to selectively etch through the etch stop layer, thereby further extending the trench, and performing a fourth etch step to enlarge an upper portion of the further extended trench, thereby forming the opening; and forming a conducive feature in the opening.

18. The method of claim 17, wherein the conductive pad comprises a copper layer formed by implementing an electro-chemical plating (ECP) process and has a substantially planar top surface.

19. The method of claim 17, wherein the forming of the conducive feature comprises:

conformally depositing a barrier layer over the passivation structure and in the opening;

forming a patterned mask layer over the barrier layer to expose a portion of the barrier layer formed in the opening;

forming a conducive layer over the barrier layer and in the opening; and selectively removing the patterned mask layer.

20. The method of claim 17, wherein a bias power of the third step is less than a bias power of the second step.

* * * * *